United States Patent
Yang et al.

(10) Patent No.: US 7,974,366 B2
(45) Date of Patent: Jul. 5, 2011

(54) LOW-LATENCY BASELINE-WANDER COMPENSATION SYSTEMS AND METHODS

(75) Inventors: Xueshi Yang, Sunnyvale, CA (US); Zining Wu, Los Altos, CA (US)

(73) Assignee: Marvell World Trade Ltd., St. Michael (BB)

( * ) Notice: Subject to any disclaimer, the term of this patent is extended or adjusted under 35 U.S.C. 154(b) by 1016 days.

(21) Appl. No.: 11/520,531

(22) Filed: Sep. 12, 2006

(65) Prior Publication Data

US 2007/0195912 A1   Aug. 23, 2007

Related U.S. Application Data

(60) Provisional application No. 60/790,388, filed on Apr. 7, 2006, provisional application No. 60/775,160, filed on Feb. 21, 2006.

(51) Int. Cl.
*H04L 25/06* (2006.01)

(52) U.S. Cl. .......................... 375/317; 375/316; 714/795

(58) Field of Classification Search ................... 375/316, 375/317, 262, 341; 714/795; 704/242
See application file for complete search history.

(56) References Cited

U.S. PATENT DOCUMENTS

| | | | |
|---|---|---|---|
| 2004/0130816 A1 | 7/2004 | Feyh et al. | |
| 2006/0064628 A1* | 3/2006 | Stein et al. | ..................... 714/795 |
| 2007/0286315 A1* | 12/2007 | Hong et al. | ..................... 375/345 |

OTHER PUBLICATIONS

Forney, G. David Jr, "The Viterbi Algorithm", Proceedings of the IEEE, vol. 61, Issue No. 3, Mar. 1973, pp. 268-278.
Raheli, R., et al., "Per-Survivor Processing: A General Approach to MLSE in Uncertain Environments", IEEE Transactions on Communications, vol. 43, Issue No. 2/3/4, Feb./Mar./Apr. 1995, pp. 354-364.

* cited by examiner

*Primary Examiner* — Chieh M Fan
*Assistant Examiner* — Leila Malek

(57) ABSTRACT

Disclosed herein are systems and methods for detecting a signal to provide a detected data sequence, comprising providing a plurality of candidate data sequences, computing baseline wander estimates associated with respective ones of the candidate data sequences, comparing a signal to each of the respective ones of the candidate data sequences, wherein the comparisons are compensated by corresponding ones of the baseline wander estimates, and choosing, based on the comparisons, one of the plurality of candidate data sequences to be the detected data sequence.

32 Claims, 18 Drawing Sheets

LOW-LATENCY BASELINE-WANDER COMPENSATION SYSTEMS AND METHODS

CROSS-REFERENCE TO RELATED APPLICATIONS

This application claims the benefit under 35 U.S.C. §119(e) of U.S. Provisional Application No. 60/775,160, filed on Feb. 21, 2006, and of U.S. Provisional Application No. 60/790,388, filed on Apr. 7, 2006, the contents of which are incorporated by reference herein in their entirety.

BACKGROUND OF THE INVENTION

Embodiments of the invention generally pertain to systems and methods for processing signals and/or data sequences that correspond to signals for applications including data recording and data communication.

In particular, embodiments of the invention pertain to systems and methods for estimating the baseline wander of a signal, and for compensating for the baseline wander of the signal during detection of the signal.

Many data recording and data communication systems include processing stages for performing a variety of data processing and/or signal processing functions on a signal. These processing stages are often alternating-current (AC) coupled for reasons that may include practical circuit design or fundamental physics considerations. By way of example, AC coupling is sometimes used in digital circuitry to couple a first digital processing stage having a certain voltage level corresponding to a logical "high" to a second digital processing stage having a different voltage level corresponding to a logical "high" so that the two digital processing stages can be used in sequence to digitally process the signal.

When the signal includes low frequency components, such as direct current (DC) components, the AC-coupling can suppress or eliminate the low frequency components in the signal, which distorts the signal. The distortion of the signal can result in fluctuation of the signal's moving-average amplitude. As used herein, a signal's moving-average amplitude, also known as its DC component, is generally referred to as the signal's "baseline" or "baseline component," and fluctuations of the baseline are generally referred to the signals "baseline wander." Thus, the above-described distortions of the signal result in baseline wandering.

In addition to AC-coupling, there are other sources of baseline wander including other processing stages, communication channels, and/or storage channels that take on high pass filter (HPF) characteristics, which distort the signal by suppressing low frequencies thereby resulting in baseline wander.

To mitigate baseline wander, designers sometimes include specialized encoders. The encoders encode an input sequence of data such that when the encoded sequence of data is modulated into a signal, the signal will have a baseline that is low in magnitude. Thus, baseline wander does not have a significant impact on the overall signal.

However, these encoders and their associated decoders add complexity to transmitter and receiver structures, and even when such encoders are used they typically do not remove all of the signal's baseline component. Thus, it would be desirable to provide improved systems and methods that estimate baseline wanders in signals and compensate for the baseline wanders when detecting the signals. It is preferable that the methods have low latency, so that compensating for the baseline wander in the signal does not add significant delay to the detection of the signal. Furthermore, it is preferable that the signal is compensated for baseline wander as it is being detected, resulting in zero or near-zero latency.

SUMMARY OF THE INVENTION

The invention, in various embodiments, addresses deficiencies in the prior art by providing systems and methods for estimating the baseline wander of a signal, and for compensating for the baseline wander in the signal during detection of the signal. In one aspect, the invention includes systems and methods that integrate baseline wander estimation and compensation within a detector. More particularly, in one aspect the systems and methods include a detector that uses local-decision feedback to compute estimates of the baseline wander, and then compensates for the baseline wander during detection of the signal. In one configuration, the detector is a trellis-based detector, such as a Viterbi detector. In certain implementations, for each stage (i.e., clock cycle) of the Viterbi detector, the systems compute baseline wander estimates for each surviving path memory in the Viterbi trellis leading to the states in that stage. The systems then compensate for the baseline wander estimates when computing and comparing Viterbi metrics (i.e., distance-based metrics) for the states. The comparison of these Viterbi metrics are used to determine which paths will be the survivor paths and which will be the discarded paths in the Viterbi detection. The systems may recursively generate the baseline wander estimates in a particular stage based in part on baseline wander estimates generated in a previous stage.

In certain implementations, the systems generate the baseline wander estimates based in part on a pre-selected model of a channel response, such as a pre-selected first order high pass filter model or a second order high pass filter model. In one feature, the invention includes systems and methods that adaptively compensate for the mismatch between the modeled channel response and the realized channel response.

In another feature, the invention includes systems and methods for use with "pipelined Viterbi" implementations, wherein information regarding paths selected as survivor paths in a previous stage may be unavailable in a current stage.

In one aspect, the invention provides a method for detecting a signal to provide a detected data sequence, comprising providing a plurality of candidate data sequences, computing baseline wander estimates associated with respective ones of the candidate data sequences, comparing a metric based on the signal to respective metrics based on the respective ones of the candidate data sequences, wherein the comparisons are compensated by corresponding ones of the baseline wander estimates, and choosing, based on the comparisons, one of the plurality of candidate data sequences to be the detected data sequence.

In one implementation, the comparisons are compensated by offsetting the respective metrics based on the respective ones of the candidate data sequences by corresponding ones of the baseline wander estimates. Comparing the metric based on the signal and choosing one of the plurality of candidate data sequences may comprise computing, at a first stage, baseline wander estimates associated with portions of respective ones of the candidate data sequences, comparing, at the first stage, a first metric based on the signal to metrics based on the portions of each of the respective ones of the candidate data sequences, wherein the comparisons are compensated by corresponding ones of the baseline wander estimates, and discarding, at the first stage, certain candidate data sequences as candidates for the detected data sequence based on the comparisons. The method may also comprise computing, at a second stage, additional baseline wander estimates associated with additional portions of respective ones of the candidate data sequences not discarded at the first stage, comparing, at the second stage, a second metric based on the signal to additional metrics based on the additional portions of each of the respective ones of the candidate data sequences, wherein the comparisons at the second stage are compensated by corresponding ones of the additional baseline wander estimates, and discarding, at the second stage, additional candidate data sequences as candidates for the detected data sequence based on the comparisons at the second stage.

In one implementation, the candidate data sequences correspond to path memories of a Viterbi trellis. The baseline wander estimates associated with respective ones of the candidate data sequences may comprise a single baseline wander estimate computed at a current stage based on a baseline wander estimate associated with a path memory at a previous stage, the previous stage being a plurality of stages prior to the current stage.

Comparing the metric based on the signal to respective metrics based on the respective ones of the candidate data sequences may comprise computing a distance measure between the metric based on the signal and each of the respective metrics based on the respective ones of the candidate data sequences. The distance measure may be based on a Euclidean distance measure.

In one implementation, choosing one of the plurality of candidate data sequences comprises choosing the candidate data sequence with a corresponding metric closest to the metric based on the signal.

The methods may include computing, at a first stage, a first plurality of baseline wander estimates associated with portions of the respective ones of the candidate data sequences, and recursively computing, at a second stage, a second plurality of baseline wander estimates based at least on the first plurality of baseline wander estimates.

Computing baseline wander estimates may comprise computing the baseline wander estimates based on a model of a source of baseline wander. The model of the source of baseline wander may comprise a high pass filter model.

Computing baseline wander estimates may comprise computing adaptive baseline wander estimates based in part on noise estimates. Computing adaptive baseline wander estimates may comprise low pass filtering noise estimates. Computing at least one of the noise estimates may be based on a corresponding previously computed adaptive baseline wander estimate, an element of a corresponding candidate data sequence, and a previously received element of the signal. Computing baseline wander estimates may further comprise computing at least one model-based baseline wander estimate based on a pre-selected model of a baseline wander source, and adding the at least one model-based baseline wander estimate to the at least one adaptive baseline wander estimate.

In another aspect, the invention includes a system for detecting a signal to provide a detected data sequence, comprising a detector having stored therein a plurality of candidate data sequences, and a baseline wander estimator for computing baseline wander estimates associated with respective ones of the candidate data sequences, wherein the detector is further configured to compare a metric based on the signal to respective metrics based on the respective ones of the candidate data sequences, wherein the comparisons are compensated by corresponding ones of the baseline wander estimates, and for choosing, based on the comparisons, one of the plurality of candidate data sequences to be the detected data sequence.

The detector may be further configured to compensate the comparisons by offsetting the respective metrics based on the respective ones of the candidate data sequences by corresponding ones of the baseline wander estimates.

In one implementation, the baseline wander estimator is configured to compute, at a first stage, baseline wander estimates associated with portions of respective ones of the candidate data sequences, and the detector is configured to compare, at the first stage, a first metric based on the signal to metrics based on the portions of each of the respective ones of the candidate data sequences, wherein the comparisons are compensated by corresponding ones of the baseline wander estimates, and discarding, at the first stage, certain candidate data sequences as candidates for the detected data sequence based on the comparisons. The baseline wander estimator may be further configured to compute, at a second stage, additional baseline wander estimates associated with additional portions of respective ones of the candidate data sequences not discarded at the first stage, and the detector is further configured to compare, at the second stage, a second metric based on the signal to additional metrics based on the additional portions of each of the respective ones of the candidate data sequences, wherein the comparisons at the second stage are compensated by corresponding ones of the additional baseline wander estimates, and discarding, at the second stage, additional candidate data sequences as candidates for the detected data sequence based on the comparisons at the second stage.

The candidate data sequences may correspond to path memories of a logical Viterbi trellis stored in the memory. The baseline wander estimates associated with respective ones of the candidate data sequences may comprise a single baseline wander estimate computed at a current stage based on a baseline wander estimate associated with a path memory at a previous stage, the previous stage being a plurality of stages prior to the current stage.

The detector may be further configured to compare the signal to each of the respective ones of the candidate data sequences by computing a distance measure between the metric based on the signal and each of the respective metrics based on the respective ones of the candidate data sequences. The distance measure may be based on a Euclidean distance measure. The detector may be configured to choose one of the plurality of candidate data sequences by choosing the candidate data sequence with a corresponding metric closest to the metric based on the signal.

The baseline wander estimator may be configured to compute baseline wander estimates by computing, at a first stage, a first plurality of baseline wander estimates associated with portions of the respective ones of the candidate data sequences, and recursively computing, at a second stage, a second plurality of baseline wander estimates based at least on the first plurality of baseline wander estimates.

In one implementation, the estimator is configured to compute the baseline wander estimates based on a model of a source of baseline wander stored in the memory. The model of the source of baseline wander may comprise a high pass filter model.

The baseline wander estimator may be configured to compute baseline wander estimates based in part on noise estimates. The baseline wander estimator may be configured to compute adaptive baseline wander estimates by low pass filtering noise estimates. The baseline wander estimator may be configured to compute at least one of the noise estimates based on a corresponding previously computed adaptive baseline wander estimate, an element of a corresponding candidate data sequence, and a previously received element of the signal.

In one implementation, the baseline wander estimator may be configured to compute baseline wander estimates by computing at least one model-based baseline wander estimate based on a pre-selected model of a baseline wander source, and adding the at least one model-based baseline wander estimate to the at least one adaptive baseline wander estimate.

In one aspect, the invention includes means for detecting a signal to provide a detected data sequence, means for providing a plurality of candidate data sequences, means for computing baseline wander estimates associated with respective ones of the candidate data sequences, means for comparing a metric based on the signal to respective metrics based on the respective ones of the candidate data sequences, wherein the comparisons are compensated by corresponding ones of the baseline wander estimates, and means for choosing, based on the comparisons, one of the plurality of candidate data sequences to be the detected data sequence.

In one implementation, the comparisons are compensated by offsetting the respective metrics based on the respective ones of the candidate data sequences by corresponding ones of the baseline wander estimates. The means for comparing the metric based on the signal and the means for choosing one of the plurality of candidate data sequences may comprise means for computing, at a first stage, baseline wander estimates associated with portions of respective ones of the candidate data sequences, means for comparing, at the first stage, a first metric based on the signal to metrics based on the portions of each of the respective ones of the candidate data sequences, wherein the comparisons are compensated by corresponding ones of the baseline wander estimates, and means for discarding, at the first stage, certain candidate data sequences as candidates for the detected data sequence based on the comparisons. The systems may also include means for computing, at a second stage, additional baseline wander estimates associated with additional portions of respective ones of the candidate data sequences not discarded at the first stage, means for comparing, at the second stage, a second metric based on the signal to additional metrics based on the additional portions of each of the respective ones of the candidate data sequences, wherein the comparisons at the second stage are compensated by corresponding ones of the additional baseline wander estimates, and means for discarding, at the second stage, additional candidate data sequences as candidates for the detected data sequence based on the comparisons at the second stage.

In one implementation, the candidate data sequences correspond to path memories of a Viterbi trellis. The baseline wander estimates associated with respective ones of the candidate data sequences may comprise a single baseline wander estimate computed at a current stage based on a baseline wander estimate associated with a path memory at a previous stage, the previous stage being a plurality of stages prior to the current stage.

The means for comparing the metric based on the signal to respective metrics based on the respective ones of the candidate data sequences may comprise means for computing a distance measure between the metric based on the signal and each of the respective metrics based on the respective ones of the candidate data sequences. The distance measure may be based on a Euclidean distance measure.

In one implementation, the means for choosing one of the plurality of candidate data sequences may comprise means for choosing the candidate data sequence with a corresponding metric closest to the metric based on the signal.

The systems may include means for computing, at a first stage, a first plurality of baseline wander estimates associated with portions of the respective ones of the candidate data sequences, and means for recursively computing, at a second stage, a second plurality of baseline wander estimates based at least on the first plurality of baseline wander estimates.

The means for computing baseline wander estimates may comprise means for computing the baseline wander estimates based on a model of a source of baseline wander. The model of the source of baseline wander may comprise a high pass filter model.

The means for computing baseline wander estimates may comprise means for computing adaptive baseline wander estimates based in part on noise estimates. The means for computing adaptive baseline wander estimates may comprise means for low pass filtering noise estimates. The means for computing at least one of the noise estimates may include means for computing the at least one of the noise estimates based on a corresponding previously computed adaptive baseline wander estimate, an element of a corresponding candidate data sequence, and a previously received element of the signal. The means for computing baseline wander estimates may further comprise means for computing at least one model-based baseline wander estimate based on a pre-selected model of a baseline wander source, and means for adding the at least one model-based baseline wander estimate to the at least one adaptive baseline wander estimate.

In another aspect, the invention may include a computer program comprising instructions for execution on a processor to detect a signal to provide a detected data sequence, the program including instructions for providing a plurality of candidate data sequences, for computing baseline wander estimates associated with respective ones of the candidate data sequences, for comparing a metric based on the signal to respective metrics based on the respective ones of the candidate data sequences, wherein the comparisons are compensated by corresponding ones of the baseline wander estimates, and for choosing, based on the comparisons, one of the plurality of candidate data sequences to be the detected data sequence.

The comparisons may be compensated by instructions for offsetting the respective metrics based on the respective ones of the candidate data sequences by corresponding ones of the baseline wander estimates. The instructions for comparing the metric based on the signal and for choosing one of the plurality of candidate data sequences may comprise instructions for computing, at a first stage, baseline wander estimates associated with portions of respective ones of the candidate data sequences, for comparing, at the first stage, a first metric based on the signal to metrics based on the portions of each of the respective ones of the candidate data sequences, wherein the comparisons are compensated by corresponding ones of the baseline wander estimates, and for discarding, at the first stage, certain candidate data sequences as candidates for the detected data sequence based on the comparisons. The program may include instructions for computing, at a second stage, additional baseline wander estimates associated with additional portions of respective ones of the candidate data sequences not discarded at the first stage, for comparing, at the second stage, a second metric based on the signal to additional metrics based on the additional portions of each of the respective ones of the candidate data sequences, wherein the comparisons at the second stage are compensated by corresponding ones of the additional baseline wander estimates, and for discarding, at the second stage, additional candidate data sequences as candidates for the detected data sequence based on the comparisons at the second stage.

In one implementation, the candidate data sequences correspond to path memories of a Viterbi trellis. The baseline wander estimates associated with respective ones of the candidate data sequences may comprise a single baseline wander estimate computed at a current stage based on a baseline wander estimate associated with a path memory at a previous stage, the previous stage being a plurality of stages prior to the current stage.

The instructions for comparing the metric based on the signal to respective metrics based on the respective ones of the candidate data sequences may comprise instructions for computing a distance measure between the metric based on the signal and each of the respective metrics based on the respective ones of the candidate data sequences. The distance measure may be based on a Euclidean distance measure.

In one implementation, the instructions for choosing one of the plurality of candidate data sequences may comprise instructions for choosing the candidate data sequence with a corresponding metric closest to the metric based on the signal.

The program may include instructions for computing, at a first stage, a first plurality of baseline wander estimates associated with portions of the respective ones of the candidate data sequences, and instructions for recursively computing, at a second stage, a second plurality of baseline wander estimates based at least on the first plurality of baseline wander estimates.

The instructions for computing baseline wander estimates may comprise instructions for computing the baseline wander estimates based on a model of a source of baseline wander. The model of the source of baseline wander may comprise a high pass filter model.

The instructions for computing baseline wander estimates may comprise instructions for computing adaptive baseline wander estimates based in part on noise estimates. The instructions for computing adaptive baseline wander estimates may comprise instructions for low pass filtering noise estimates. The instructions for computing at least one of the noise estimates may include instructions for computing the at least one of the noise estimates based on a corresponding previously computed adaptive baseline wander estimate, an element of a corresponding candidate data sequence, and a previously received element of the signal. The instructions for computing baseline wander estimates may further comprise instructions for computing at least one model-based baseline wander estimate based on a pre-selected model of a baseline wander source, and instructions for adding the at least one model-based baseline wander estimate to the at least one adaptive baseline wander estimate.

BRIEF DESCRIPTION OF THE DRAWINGS

These and other features and advantages will be more fully understood by the following illustrative description with reference to the appended drawings, in which like elements are labeled with like reference designations.

DETAILED DESCRIPTION

The invention, in various embodiments, provides systems and methods for estimating the baseline wander of a signal, and for compensating for the baseline wander in the signal. The following detailed description of the invention refers to the accompanying drawings. The following detailed description does not limit the invention. Instead, the scope of the invention is defined at least by the appended claims and equivalents.

Figure 1:
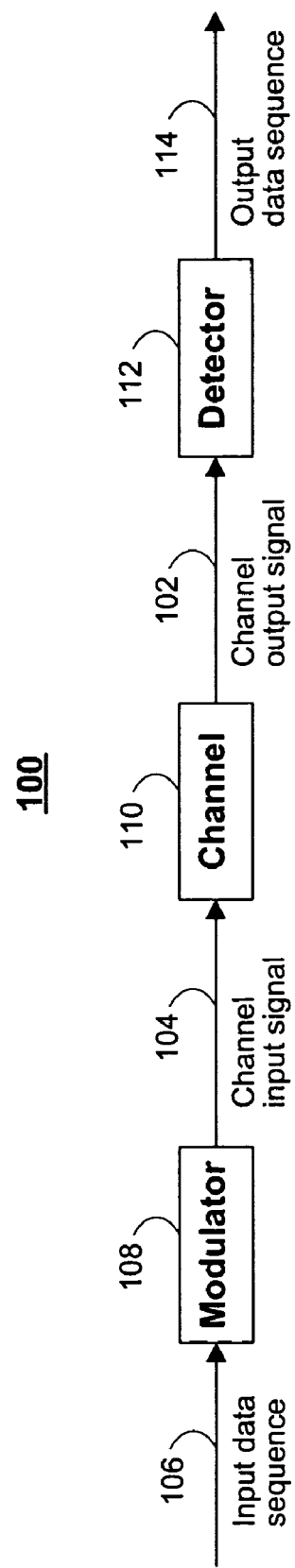
FIG. 1 shows an exemplary system that produces a channel output signal that is a distorted version of a channel input signal.

FIG. 1 shows an exemplary system 100 that produces a channel output signal 102 that is a distorted version of a channel input signal 104, according to an illustrative embodiment of the invention. More particularly, the system 100 includes an input data sequence 106, a modulator 108 that modulates the input data sequence 106 to produce the channel input signal 104, and a channel 110 which produces the channel output signal 102 based on the channel input signal 104. The channel output signal 102 is provided to a detector 112, which detects the channel output signal 102 to produce a detected data sequence 114.

The channel output signal 102 is a distorted version of the channel input signal 104. The distortion may be due to baseline wander, or other sources of distortion as will be discussed in more detail below. The detector 112 attempts to produce a detected data sequence 114 that is the same as the input data sequence 106. Certain other exemplary systems discussed herein will include additional components that work in conjunction with the detector 112 to estimate and compensate for baseline wander. Others will include alternative detectors to the detector 112 that will incorporate baseline wander estimation and compensation into the detection process. Thus, the system 100 represents a baseline system upon which other systems described herein will provide improved performance.

In certain embodiments, an application generates the input data sequence 106 so that the input data sequence 106 can be transmitted over a communications channel and can subsequently be recovered at another place. In other embodiments, an application generates the input data sequence 106 so that the input data sequence 106 can be stored on a recording medium, such as a magnetic recording medium, and subsequently be recovered at another time. The input data sequence 106 is generally provided in the form of a sequence of binary digits, or bits (i.e., a sequence of 1's and 0's). However, in the case where an application generates data in another form, other preprocessing components (not shown) may encode the data into a sequence of bits. The input data sequence 106 may be associated with a variety of sources of data, including, by way of example, text, audio, image, and/or video data.

The modulator 108 modulates the input data sequence 106 to produce the channel input signal 104. The modulator 108 represents a device which provides a communication or storage signal, such as the channel input signal 104, that is suitable for delivery on the channel 110. For example, in certain embodiments the modulator 108 generates a communication signal waveform by manipulating the frequency, amplitude, and/or phase of a transmitted electromagnetic signal based on the input data sequence 106. In other embodiments, the modulator 108 generates a magnetic storage signal waveform by storing the input data sequence 106 onto a magnetic storage medium. Certain exemplary modulators include a non-return-to-zero (NRZ) modulator, and a non-return-to-zero-inverse (NRZI) modulator. By way of example, in an NRZ modulator, when the input data sequence 106 includes a '1' information bit, the modulator 108 modulates the channel input signal 104 to include a corresponding rectangular pulse of some positive amplitude A, and when the input data sequence 106 includes a '0' information bit, the modulator 108 modulates the channel input signal 104 to include a corresponding rectangular pulse of some negative amplitude −A.

The channel 110 represents a medium on which the channel input signal 104 is transmitted and/or stored. In certain embodiments, the channel 110 corresponds to a communication signal-bearing channel, such as a wireless communication channel or a wired communication channel. In other embodiments, channel 110 corresponds to a storage medium, such as a magnetic storage medium (e.g., a hard drive), an optical storage medium (e.g., a CD), or an electrical storage medium (e.g., random access memory). For example, the channel 110 can correspond to a read path of a disk drive, including a magnetic storage medium, disk-drive read head, and other devices. The channel 110 may also represent events associated with the medium. For example, the channel 110 may represent an occurrence of physical damage to the storage medium and/or signal bearing communication channel. In various implementations, the systems and methods of this invention may be used with any channel 110 that is characterized by inter-symbol interference (ISI).

Additionally, the channel 110 may include one or more AC-coupling stages in sequence with any one or more of the above-mentioned components. As mentioned above, AC-couplers are often used to couple signal- or data-processing stages due to, for example, practical circuit design or fundamental physics considerations. Also as mentioned above, when the channel input signal 104 includes low frequency components, such as direct current (DC) components, the one or more AC-coupling stages can suppress or eliminate the low frequency components in the channel input signal 104, which results in baseline wandering.

Figure 2:
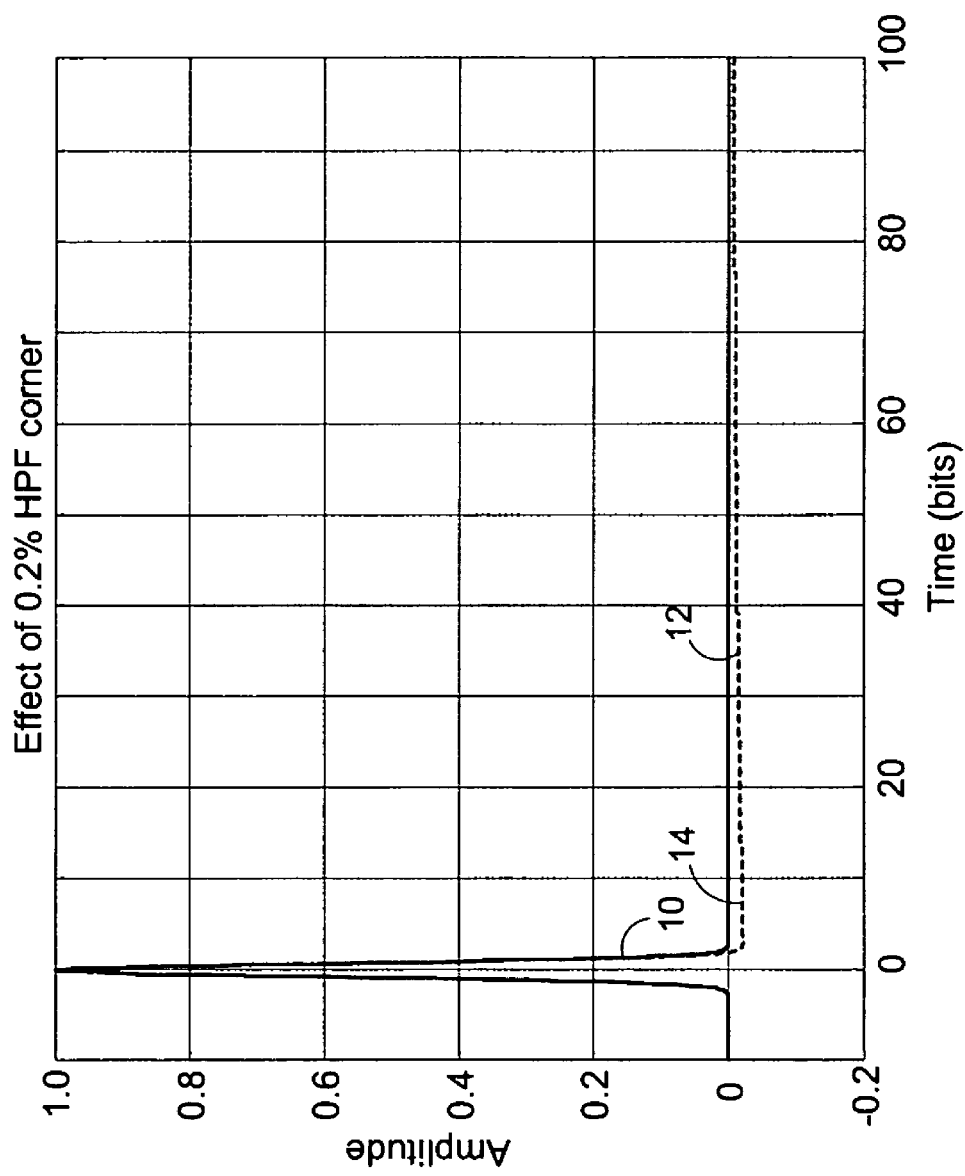
FIG. 2 shows the impact of AC coupling and the associated baseline wandering on the impulse response of an exemplary perpendicular magnetic recording channel.

More particularly, FIG. 2 shows the impact of AC coupling and the associated baseline wandering on the impulse response of an exemplary perpendicular magnetic recording channel. The solid line shows the impulse response 10 of the exemplary channel without any AC coupling stages. In contrast, the dotted line shows the impulse response 12 of the exemplary channel with AC coupling stages. The AC coupling results in a dip, most pronounced in the region 14, of the response 12 of the AC coupled channel when compared with the response 10 of the channel without AC coupling. The dip 14 represents the distortion. If several impulses are transmitted sequentially over a channel with AC-coupling, each response will include a dip 14 and the dips 14 of the various impulse responses may accumulate, resulting in accumulated distortion.

Due to the distortion from this baseline wandering and/or from the other channel-related events described above, the channel 110 may corrupt the channel input signal 104 and thus provide a channel output signal 102 that may be different from the channel input signal 104. The sources of the signal corruption are referred to herein as "noise," and can include interference sources that may be external and/or internal to the channel 110. By way of example, the sources of signal corruption may include other interfering communications signals, or physical corruption to a magnetic storage medium or read devices associated therewith.

Returning to FIG. 1, the channel output signal 102 is processed by a detector 112. The detector 112 samples the channel output signal 102 and detects the channel output signal 102 to produce a detected data sequence 114 which is an estimate of the input data sequence 106. Exemplary implementations for the detector 112 will be discussed below. Ideally, the detector 112 will overcome any corruption due to the baseline wandering and/or other noise sources mentioned above, and the detected data sequence 114 will exactly match the input data sequence 106. However, this may not always be the case, and certain bits of the detected data sequence 114 may be in error with respect to the input data sequence 106 resulting in a bit error rate (BER). In order to reduce the BER, the systems described herein will include components for estimating and compensating for the baseline wander of the channel output signal 102.

Figure 3:
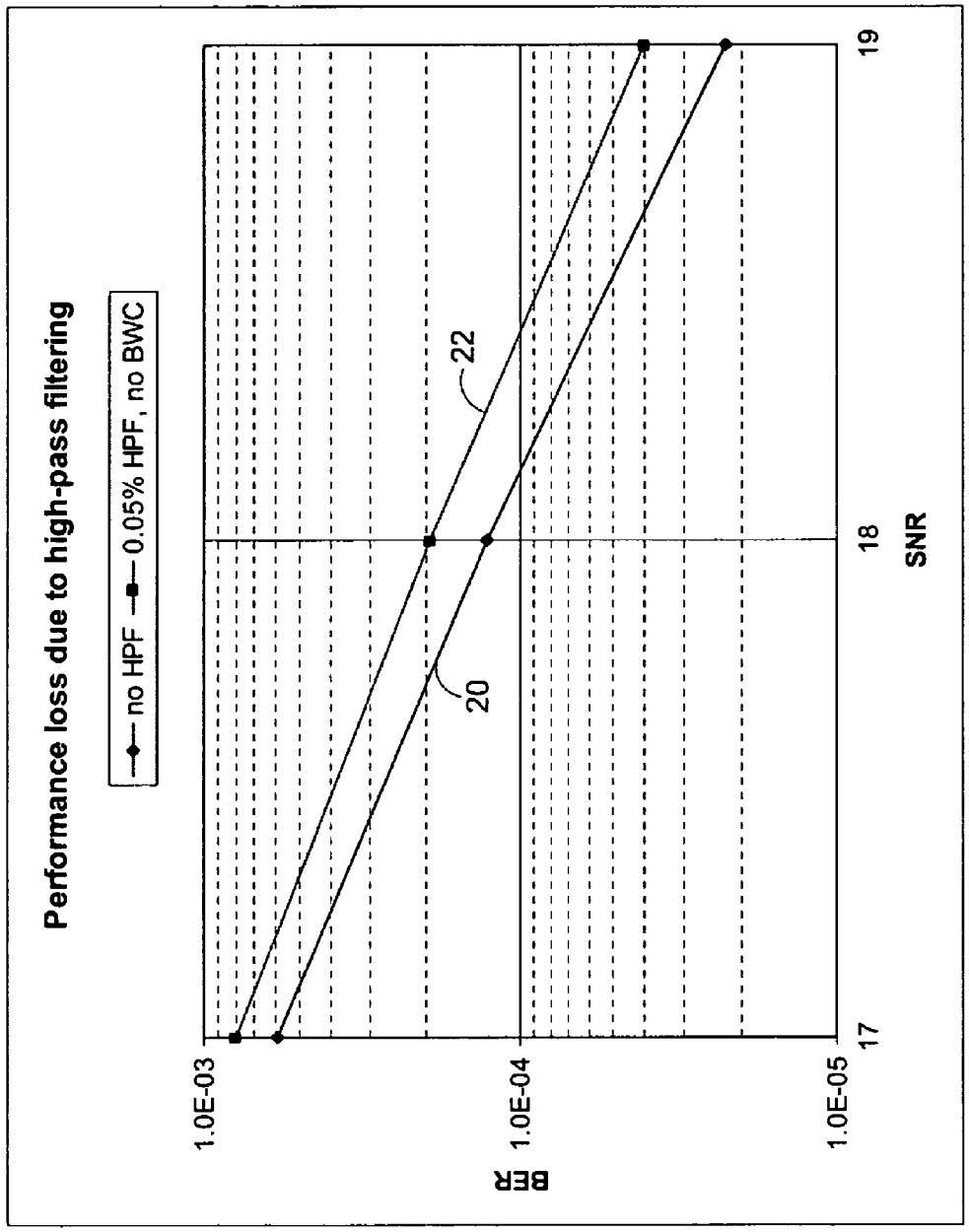
FIG. 3 shows the increase in bit error rate (BER) when an exemplary channel suppresses low frequencies but the detector does not compensate for baseline wander.

FIG. 3 shows the increase in BER when an exemplary channel suppresses low frequencies (through, for example, AC coupling) but the detector 112 does not compensate for baseline wander. The solid line depicts the BER 20 on a logarithmic scale of the exemplary channel without high-pass filter (HPF) stages as a function of the signal to noise ratio (SNR) of the channel input signal 104. In contrast, the dotted lines 22 depicts the SNR of the channel with one or more HPF stages, such as AC coupling stages. As shown, the HPF stages result in an increase in the BER.

Figure 4:
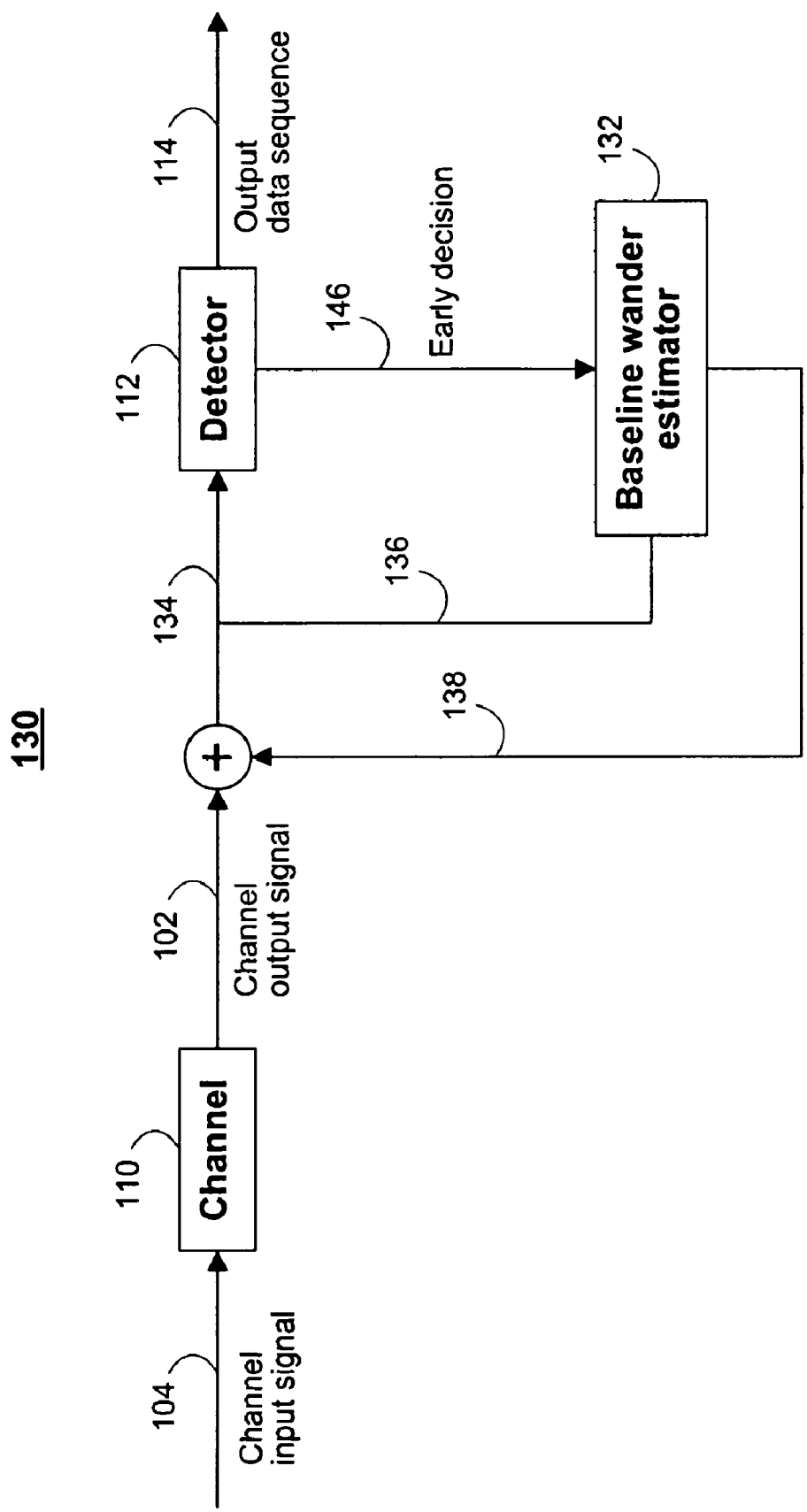
FIG. 4 shows an exemplary system similar to the system of FIG. 1, but also including a baseline wander estimator to compensate for baseline wander.

FIG. 4 shows an exemplary system 130 similar to the system 100 of FIG. 1, but also including a baseline wander estimator 132 to compensate for baseline wander in the channel output signal 102. More particularly, the system 130 includes the baseline wander estimator 132 in communication with the detector 112. As will be further described below, the baseline wander estimator 132 provides a feedback function to compensate the channel output signal 102. In operation, the channel output signal 102 is provided to the detector 112 via link 134 and to the baseline wander estimator 132 via link 136. The detector 112 may be any detector known in the art. For example, in the case where the channel is an inter-symbol interference (ISI) channel, the detector 112 can be a Viterbi detector. The detector 112 generates an early decision data sequence 146 that represents an initial estimate of the input data sequence 106. The baseline wander estimator 132 generates a baseline wander estimate of the channel output signal 102 using methods known in the art. In order to compensate for the baseline wander, the baseline wander estimate is subtracted from the channel output signal 102 via link 138.

The compensated channel output signal is then transmitted over link 134 to the detector 112.

In certain implementations, the steps of the detector 112 generating the early decision 146 and the baseline wander estimator 132 generating a baseline wander estimate may require a computation time of several clock cycles. Because of this latency, the baseline wander estimate is applied to a more recent portion of the channel output signal 102 than the portion on which the baseline wander estimate was based on. Since this more recent portion of the channel output signal 102 may have a different baseline wander, the above-described latency can result in inaccurate baseline wander estimates.

Figure 5:
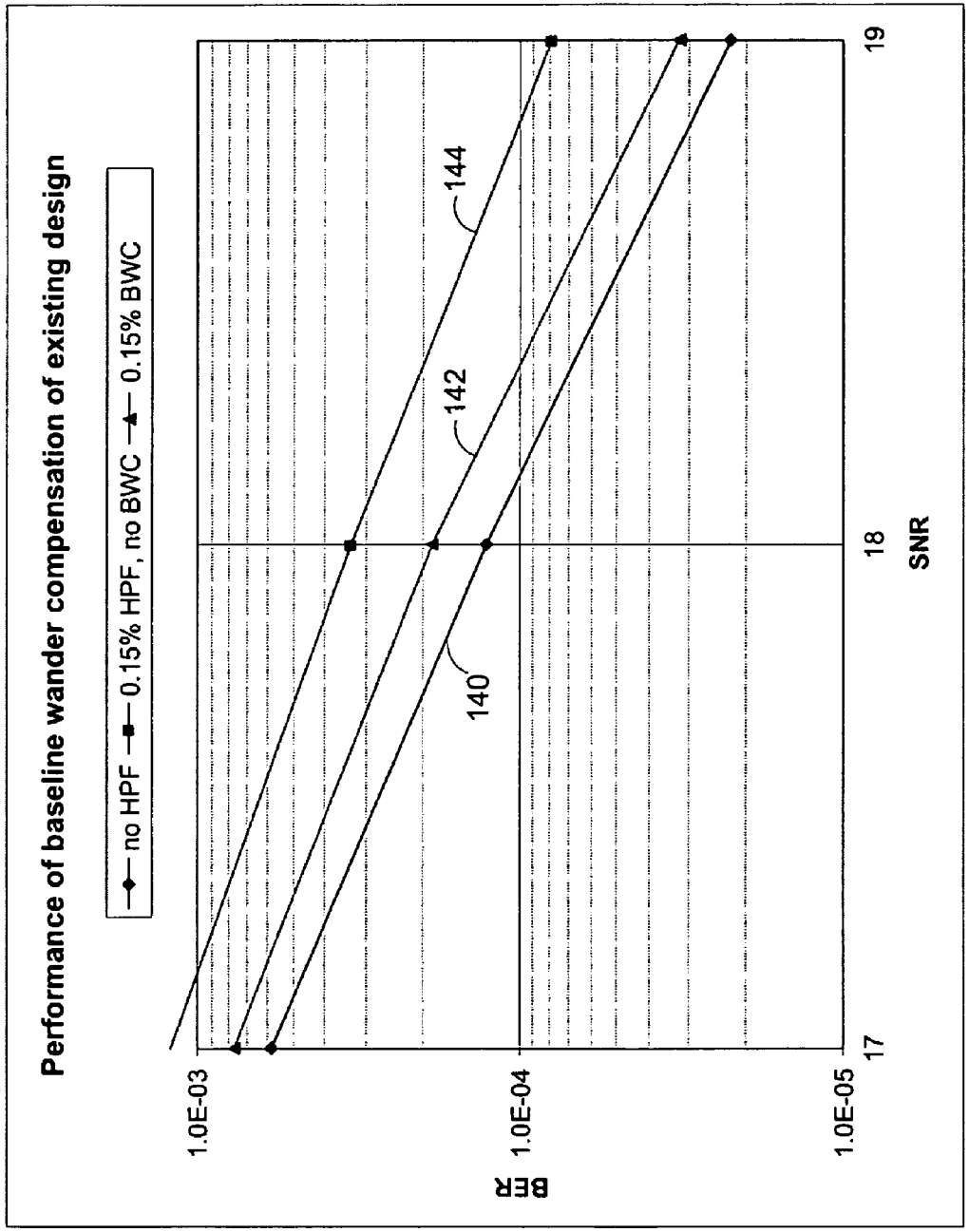
FIG. 5 shows the performance of the system of FIG. 4 with an exemplary channel 110.

FIG. 5 shows the performance of the system 130 with an exemplary channel 110. The bottom solid line marked with a diamond shows the BER 140 of the system 130 on a logarithmic scale using the exemplary channel 110 without any HPF stages, as a function of SNR. This BER 140 represents a baseline for comparison. The dotted line marked with a square shows the BER 144 of the system 100 using the exemplary channel 110, but having HPF stages, and without baseline wander estimation and compensation. Finally, the dotted line marked with a triangle shows the BER 142 of the system 130 using the exemplary channel 110, having HPF stages and baseline wander estimator 132. As shown, the system 130 with the baseline wander estimator 132 provides a lower BER than the system 100 without the baseline wander estimator 132.

Despite the improved BER, the system 130 suffers from disadvantages, such as delay. Referring again to FIG. 4, before the baseline wander estimator 132 can estimate the baseline wander of the channel output signal 102, the detector 112 must generate the early decision data sequence 146. These steps incur estimation delays. In certain implementations, the delay can be between about 10 symbol periods and about 50 symbol periods. This delay may be a drawback for certain delay sensitive applications. Moreover, this delay limits the timescale on which the baseline wander estimator 132 can operate. More particularly, the baseline wander estimator 132 may be unable to compensate for baseline wanders that fluctuate at frequencies higher than a certain cap frequency which is closely related to the estimation delay. Although additional circuits can be designed to reduce the impact from this delay, such additional circuits introduce additional complexity and latency to the system 130.

Figure 6:
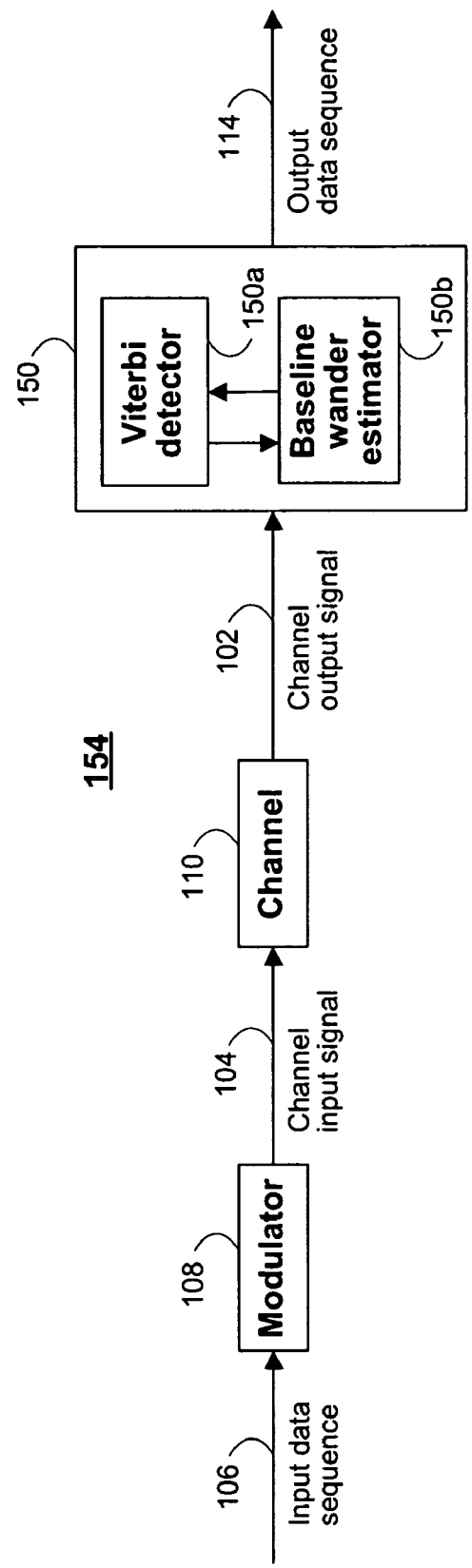
FIG. 6 shows a system that is similar to the system of FIG. 1, but having a modified detector.

In accordance with one aspect of the invention, FIG. 6 shows a system 154 that is similar to the system 100 of FIG. 1, but having a modified detector 150 instead of the detector 112. The illustrated system 154 corresponds to the case where the channel 110 is an inter-symbol interference (ISI) channel, which produces output signals that are, effectively, convolutions of signals entering the ISI channel. Accordingly, the modified detector 150 includes a trellis-based Viterbi detector 150*a*. As will be described below, the modified detector 150 incorporates the functions of a baseline wander estimator 150*b* and a modified Viterbi detector 150*a* that compensates for the baseline wander to produce the detected data sequence 114. While the modified Viterbi detector 150*a* and the baseline wander estimator 150*b* are depicted as two functional modules in FIG. 6, their functionalities may be realized by a single module. The modified detector 150 reduces, and in some implementation completely or substantially eliminates, the delays discussed in connection with the system 130 of FIG. 4.

Figure 7:
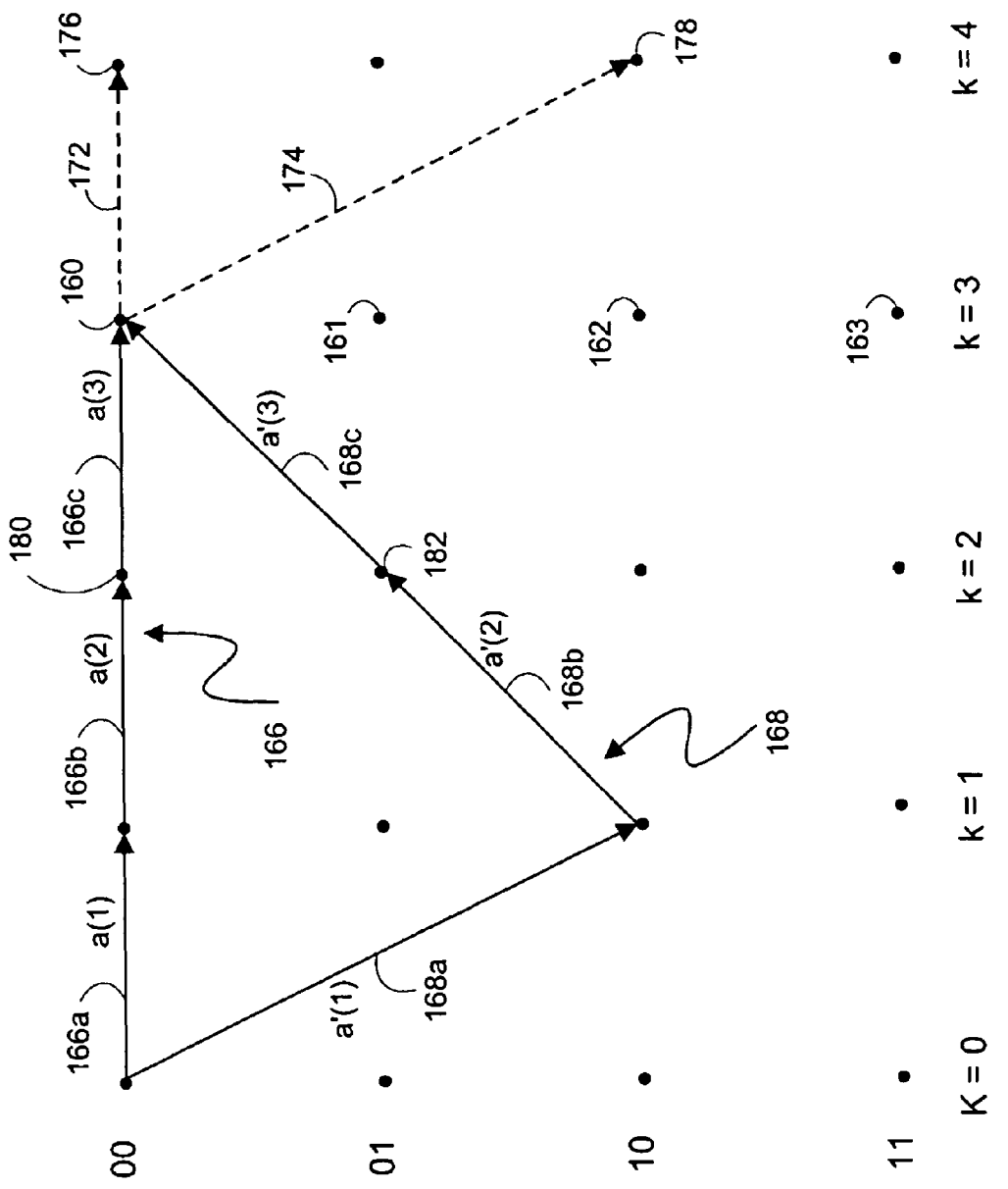
FIG. 7 shows a Viterbi trellis for illustrating the method of operation of one implementation of the modified detector of FIG. 6.

FIG. 7 illustrates the method of operation of one implementation of the modified Viterbi detector 150*a* of the modified detector 150. In this exemplary implementation, the modified Viterbi detector 150*a* operates similarly to a conventional Viterbi detector but includes certain additional and/or alternative processing functionality in order to estimate and compensate for baseline wander. The method of operation of this implementation of the modified Viterbi detector 150*a* will be described in connection with the illustrated Viterbi trellis 158. However, it is contemplated that the disclosed technology will also apply to other trellis structures.

The trellis 158 includes a plurality of stages k which are depicted as k=1, . . . , 4, and a plurality of states in each stage k (e.g., the states 160-163 are in stage k=3). Generally, as in the operation of a conventional Viterbi algorithm, the stages k represent a particular time unit (e.g. clock cycle) and the states in a stage k represent possible states of the system at the stage k. The trellis 158 includes branches which represent transitions from a state in a stage k to a state in a subsequent stage k+1. For example, branch 166*c* represents a transition from state 180 of stage k=2 to state 160 of stage k=3. Thus, the plurality of states in the trellis 158 will mark beginnings and endings for branches (i.e., state 180 marks the beginning of branch 166*c* and state 160 marks the ending of branch 166*c*). Sequences of branches leading up to a state make up path memories for that state (i.e., branches 166*a*-*c* make up the path memory 166 for state 160).

Each branch corresponds to a candidate symbol that may have been a part of the input data sequence 106 transmitted via the channel input signal 104. Thus, the path memories 166 and 168 correspond to data sequences that are candidates for portions of the input data sequence 106, sometimes referred to herein as "candidate data sequences," and are therefore candidates for portions of the detected data sequence 114 that will be chosen by the modified Viterbi detector 150*a*.

The modified Viterbi detector 150*a* operates by keeping certain path memories as survivors that are likely to be accurate decodings of the channel output signal 102 and discarding, or pruning, other path memories that are not as likely to be accurate decodings of the channel output signal 102. In this manner, the modified detector 150 determines a detected data sequence 114 that is the most likely to be an accurate decoding of the channel output signal 102. In order to determine, at each stage k, which path memories will be survivors and which will be pruned, the modified Viterbi detector 150*a* compares the channel output signal 102 to the candidate data sequences (i.e., path memories) by comparing Viterbi metrics associated with the path memories.

The Viterbi metrics computed at each stage k are generally determined based in part on a sample of the channel output signal 102 taken at the stage k. This sample, which may be taken by, for example, the modified detector 150, is denoted herein as y(k). The sample y(k) includes a transmitted portion x(k) that represents a corresponding value of the channel input signal 104, as well as a noise portion n(k) (from, i.e., baseline wander or the other noise sources described above).

$$y(k)=x(k)+n(k) \quad (1)$$

The operation of the modified Viterbi detector 150*a*, and how certain paths are chosen as survivor paths and others are pruned, will be discussed in more detail with respect to the exemplary stage k=3. The exemplary trellis 158 is for a binary inter-symbol interference (ISI) channel with a channel impulse response length of I=3 (i.e., the modified detector 150 has a memory of 2 symbols). Thus, at each time k, the trellis includes $2^{I-1}=4$ states. By way of example, stage k=3 includes the 4 states 160-163. Each of the 4 states in each stage is associated with a particular symbol memory that is an element of {00, 01, 10, 11}. By way of example, the exemplary states 160, 161, 162, and 163 are associated with the memories 00, 01, 10, and 11 respectively.

As mentioned above, each branch corresponds to a candidate symbol that may have been a part of the input data sequence 106 transmitted via the channel input signal 104, and the path memories correspond to data sequences that are candidates for portions of the input data sequence 106. By way of example, the path 168 begins at a state 00, and includes a first branch 168a corresponding to a first candidate symbol and leading to a 10 state, a second branch 168b corresponding to a second candidate symbol and leading to a 01 state, and a third branch 168c corresponding to third candidate symbol and leading to the 00 state 160. The candidate symbol represented by each branch may vary depending on the modulation technique employed, and/or other encoders that may be used in mapping the input data sequence 106 to the channel input signal 104. As an example, the branches 168a, 168b, and 168c may correspond to the data elements 1, 0, and 0 respectively, so that the path memory 168 corresponds to the data sequence 1, 0, 0.

More generally, the element of the data sequence corresponding to path 166 at stage k will be referred to herein as a(k), and the element of the data sequence corresponding to the path 168 at stage k will be referred to herein as a'(k). Since these elements correspond to candidates for what was actually sent on the channel input signal 104 (i.e., without any noise), these elements are sometimes referred to herein as "candidate signals." Whereas x(k) refers to what was actually sent on the channel input signal 104.

In accordance with the operation of a conventional Viterbi algorithm for a binary modulated implementation, during each of the stages k, path memories are pruned and generated such that at each stage k, each of the 4 states associated with that stage has two incoming path memories. By way of example, state 160 has the two depicted incoming path memories 166 and 168. The path memories leading to other states at stage k=3 are not depicted.

At the state 160, the modified Viterbi detector 150a will prune one of the path memories, 166 or 168, from the trellis 158 and choose the other path memory, 166 or 168 as the case may be, to be a survivor path. Subsequently, the survivor path will be extended by branch 172 to form a path memory leading to state 176 in stage k=4, and will also be extended by branch 174 to form a path memory leading to state 178 in stage k=4. As with the other branches of the trellis 158, the branches 172 and 174 will correspond to respective candidate symbols (e.g., 0 or 1).

As mentioned, the modified Viterbi detector 150a uses Viterbi metrics to choose the survivor path at stage k=3. The Viterbi metrics used at stage k=3 are based on Viterbi metrics used in stage k=2. More particularly, once survivor paths have been chosen at the states in stage k=2, those states are associated with respective Viterbi metrics that correspond to the chosen survivor paths. These Viterbi metrics are denoted herein as $u_{ij,k}$ where k denotes the stage of the state and ij is an element of {00, 01, 10, 11} corresponding to the memory associated with that state. By way of example, in the depicted state 180 the path memory including branches 166a and 166b was chosen as the survivor path. Thus, the state 180 is associated with a Viterbi metric $u_{00,2}$ that corresponds to this path memory. Similarly, at state 182 the depicted path memory including branches 168a and 168b was chosen as the survivor path, and the state 182 is associated with a Viterbi metric $u_{01,3}$ that corresponds to this path memory.

In addition to the Viterbi metrics from stage k=2, path memories are pruned or chosen as survivors based on the sample y(3) of the channel output signal 102. As mentioned above, the sample y(3) includes a transmitted portion x(3) that represents the corresponding value of the channel input signal 104, as well as a noise portion n(3) (from, i.e., baseline wander or the other noise sources described above). However, from the detector's point of view, the detector knows the value of y(3) but does not know the values of x(3) and n(3).

$$y(3)=x(3)+n(3) \quad (2)$$

Returning briefly to FIG. 2, a detector 112 that does not incorporate baseline wander estimation and detection will be discussed, and subsequently the algorithmic modifications for the modified detector 150 of FIG. 6 that enable it to estimate and compensate for baseline wander will be discussed. The detector 112 (that is, a detector that does not incorporate baseline wander estimation and compensation) using a conventional Viterbi algorithm may operate at stage k=3 as follows:

$$\text{If } u_{00,2}+(y(3)-a(3))^2 < u_{01,2}+(y(3)-a'(3))^2, \text{ choose } 166 \text{ as the survivor path.} \quad (3)$$

$$\text{If } u_{00,2}+(y(3)-a(3))^2 > u_{01,2}+(y(3)-a'(3))^2, \text{ choose } 168 \text{ as the survivor path.} \quad (4)$$

$$\text{If } u_{00,2}+(y(3)-a(3))^2 = u_{01,2}+(y(3)-a'(3))^2, \text{ randomly choose (or choose based on a pre-determined rule) between } 166 \text{ or } 168 \text{ as the survivor path} \quad (5)$$

$$\text{Set } u_{00,3}=\min\{u_{00,2}+(y(3)-a(3))^2, u_{01,2}+(y(3)-a'(3))^2\} \quad (6)$$

Thus, this implementation compares metrics based on the channel output signal 102, in this case signal samples of the channel output signal 102, to metrics based on the path memories, in this case the candidate samples of the path memories, by computing Viterbi metrics that are generally running tallies of Euclidean distances between the samples of the channel output signal 102 to the candidate signals corresponding to the path memories. In various implementations, the metric based on the path memories may be a point of a constellation in one-dimensional or multi-dimensional Euclidean space, and the metric based on the channel output signal 102 may be another point in the Euclidean space. This implementation chooses survivor paths (c.f. equations (3-5)) that correspond to data sequences which are closest, in a Euclidean distance sense, to the sequence of samples from the channel output signal 102. In addition to choosing a survivor path, this implementation associates a Viterbi metric $u_{00,3}$ with the state 160 (c.f. equation (6)) so that the states 176 and 178 in stage k=4 can utilize this metric in determining a survivor path.

For ease of exposition, in some cases in the description below, comparing a metric based on a signal to a metric based on a path memory or a candidate data sequence will simply be referred to as comparing a signal to a path memory, or comparing a signal to a candidate data sequence.

As mentioned above in connection with FIG. 4, in certain implementations the channel output signal 102 is compensated for baseline wander before being processed by the detector 112. Thus, the terms y(3) in Equations (3-6) above may be terms that are already compensated for baseline wander. However, in the implementation of FIG. 4, each of the terms y(3) will be compensated by the same baseline wander estimate, and the baseline wander estimate may be inaccurate due to latency in the computation of the baseline wander estimate, as mentioned above.

In contrast to this implementation of the detector 112 of FIG. 2, and in accordance with one aspect of the invention, the modified detector 150 of FIG. 6 incorporates baseline wander estimation and baseline wander computation in the above-described methods. More particularly, the baseline wander estimator 150b generates a baseline wander estimate for each path memory, and these are used by the modified Viterbi detector 150a. However, as mentioned above, the functionalities of the baseline wander estimator 150b and the modified Viterbi detector 150a may be realized by a single module. The baseline wander estimates for the respective path memories ending at a stage k along the path memory 166 are denoted herein as B(k). For example, the baseline wander estimator 150a generates a baseline wander estimate B(2) for the path memory that includes branches 166a-b and ends at state 180 in stage k=2. Similarly, there is a baseline wander estimate B(3) for the path memory that includes branches 166a-c and ends at state 160. Additionally, the baseline wander estimates for the path memories ending at a stage k along the path memory 168 are denoted herein as B'(k). For example, there is a baseline wander estimate B'(2) corresponding to the path memory that includes branches 168a-b and ends at state 182 in stage k=2. Similarly, the modified detector 150 generates a baseline wander estimate B'(3) for the path memory including branches 168a-c and ending at state 160.

Methods for computing the baseline wander estimates will be discussed in more detail below. In order to compensate for the baseline wander estimates B(3) and B'(3) at stage k=3, the above-described computations of equations (3-6) are modified as follows for the modified Viterbi detector 150a:

If $u_{00,2}+(y_3+B(3)-a_3)^2 < u_{01,2}+(y_3+B'(3)-a_3')^2$, choose 166 as the survivor path. (7)

If $u_{00,2}+(y_3+B(3)-a_3)^2 > u_{01,2}+(y_3+B'(3)-a_3')^2$, choose 168 as the survivor path. (8)

If $u_{00,2}+(y_3+B(3)-a_3)^2 = u_{01,2}+(y_3+B'(3)-a_3')^2$, randomly choose (or choose based on a pre-determined rule) between 166 or 168 as the survivor path. (9)

Set $u_{00,3} = \min\{u_{00,2}+(y(3)+B(3)-a(3))^2, u_{01,2}+(y_3+B'(3)-a'(3))^2\}$ (10)

Thus, the modified Viterbi detector 150a compensates for the baseline wander estimates B(3) and B'(3) by offsetting the received signal sample y(3) by the baseline wander estimates B(3) and B'(3). In certain implementations, the baseline wander estimates B(3) and B'(3) are added to the received signal sample y(3) as in Equations (7-10), and in others they are subtracted. Whether they are added or subtracted will typically depend on the sign convention (positive or negative) used when computing the baseline wander estimates B(3) and B'(3), as will be discussed below.

Exemplary methods for computing baseline wander estimates are now described with reference to the exemplary baseline wander estimate B(3) corresponding to the path memory 160 which, as mentioned above, corresponds to the sequence of a(1), a(2), a(3).

In accordance with one aspect of the invention, and as will be described below, the baseline wander estimator 150b generally computes baseline wander estimates based on a pre-selected model for the high pass filter components of channel 110. Analysis of the pre-selected models will give rise to recursive formulas for computing the baseline wander estimate B(k) at a stage k based on the baseline wander estimate B(k−1) from a previous stage k−1. More particularly, as will be shown below, formulas based on certain exemplary models take the following general form:

$B(k) = (1-\beta)B(k-1) + \beta a(k-1)$ (11)

In certain implementations, β is chosen to be a small constant, such as, for example, 0.01, and each baseline wander estimate B(k) is a weighted average of the previous baseline wander estimate B(k−1) and the previous candidate symbol a(k−1). The formulas described below may be similar to this formula, but may also include other scaling factors for one or more of the terms B(k), (1−β)B(k−1), and/or β a(k−1).

As mentioned, the specific method with which the baseline wander estimator 150b computes the baseline wander estimates will vary depending on the type of model chosen for the high pass filter components of channel 110. The models can be infinite impulse response (IIR) filter-based models, finite impulse response (FIR) filter-based models, or convolutions of one or more IIR filters with one or more FIR filters. In certain implementations, one or more of the FIR and/or IIR filters include near-DC poles to model the AC-coupling and/or high-pass filtering of the channel 110.

One exemplary baseline wander estimation method is based on a family of IIR filter-based channel models; namely, single pole (i.e., first order) high-pass filter (HPF) models. A single pole HPF can be characterized by the s-domain transfer function:

$$H(s) = \frac{s}{s + 2\pi\alpha f_c} \quad (12)$$

The parameter α represents the fractional corner frequency of the HPF, and $f_c$ represents the channel baud rate. These parameters can be chosen by a modeler, for example, after experimentation with the channel 110. The discrete-time transfer function H(z) corresponding to H(s) can be obtained by using the bilinear transformation given by:

$$s = 2f_c \frac{z-1}{z+1} \quad (13)$$

to obtain the discrete-time transfer function:

$$H(z) = g\left[1 - \frac{\Delta z^{-1}}{1-(1-\Delta)z^{-1}}\right] \quad (14)$$

where $$g = \frac{1}{1+\pi\alpha}, \text{ and } \Delta = \frac{2\alpha\pi}{1+\alpha\pi}. \quad (15)$$

In other exemplary techniques, the factor of $2f_c$ in the bilinear transform of Equation (13) may be replaced by another factor. This factor may be based in part on the sampling period associated with the modified detector 150.

Now denote the z-transform of the ideal channel response of channel 110 as T(z). T(z) represents the response of channel 110 without high pass filter components that result in baseline wander. In certain embodiments, the system 154 includes an equalizer (not shown), and the ideal channel response T(z) may represent the combined response of the channel 110 and the equalizer, without the high pass filter components that result in baseline wander.

The overall response for the channel output signal 102 that is seen by the modified detector 150 is given by:

$$T(z)H(z) = T(z)g\left[1 - \frac{\Delta z^{-1}}{1-(1-\Delta)z^{-1}}\right] \quad (16)$$

$$= gT(z) - gT(z)\frac{\Delta z^{-1}}{1-(1-\Delta)z^{-1}}$$

Let x(z) denote the z-transform of the channel input signal 104. Then, the channel output signal 102 is given in the z-domain by:

$$= x(z)gT(z) - x(z)gT(z)\frac{\Delta z^{-1}}{1-(1-\Delta)z^{-1}} \quad (17)$$

The common term g in Equation (17) is a scaling factor that can be adjusted by gain control circuitry. Thus, aside from this scaling factor g, the term x(z)T(z) corresponds to the desired channel output ("candidate signal"), and the term $$x(z)T(z)\frac{\Delta z^{-1}}{1-(1-\Delta)z^{-1}} \quad (18)$$

corresponds to the baseline wander that we would like to cancel from the channel output signal 102. More particularly, Expression (18) represents the negative of the baseline wander that the systems and methods will cancel from the channel output signal 102, and therefore the baseline wander estimate computed based on Expression (18) will be added to, rather than subtracted from, the received signal y(3).

As mentioned above, the baseline wander estimate B(3) that is being computed is associated with the path memory 166 having the data sequence a(1), a(2), a(3). The z-domain representation of this sequence is given by:

$$A(z) = \sum_{i=0} a_{k-i} z^{-i} \quad (19)$$

Since the path memory 166 corresponds to "candidate signals" as mentioned above, the z-transform of the candidate signal can be expressed as:

$$A(z) = x(z)T(z) \quad (20)$$

Thus, using Equation (20) in Expression (18), the baseline wander estimates B(k), when written in the z-domain, can be expressed as:

$$B(z) = A(z)\frac{\Delta z^{-1}}{1-(1-\Delta)z^{-1}} \quad (21)$$

This z-domain representation can be equivalently expressed with the following recursive time domain representation:

$$B(k) = (1-\Delta)B(k-1) + \Delta a(k-1)$$

Thus, the exemplary baseline wander estimate B(3) for path memory 166 at time k=3 can be expressed as $$B(3) = (1-\Delta)B(2) + \Delta a(2) \quad (23)$$

Similarly, the baseline wander estimate B'(3) for path memory 168 at time k=3 can be computed as:

$$B'(3) = (1-\Delta)B'(2) + \Delta a'(2) \quad (24)$$

These baseline wander estimates can then be used by the modified Viterbi detector 150a in the selection of a survivor path as described above in connection with Equations (7-10).

As mentioned above, the survivor path, 166 or 168, is extended by branch 172 and by branch 174 during the next stage to form two path memories, one which leads to state 176 and another which leads to state 178. The baseline wander estimate for these path memories will be equal, and can be recursively computed based on the baseline estimate, B(3) or B'(3) as the case may be, of the surviving path, 166 or 168. More particularly, and by way of example, if the path memory 166 is chosen as the survivor path, then the baseline wander estimate at state 176 for the path memory including branches 166a-c and branch 172 as well as the baseline wander estimate at state 178 for the path memory including branches 166a-c and branch 174 can be expressed as:

$$B(4) = (1-\Delta)B(3) + \Delta a(3) \quad (25)$$

In other implementations, various other scaling factors may be used for the terms in Equation (22). The scaling factors can be based in part on approximations on z-domain responses in any of the above-described computations.

Additionally, various mappings from the s-domain to the z-domain can be used. While bilinear transforms are described above, other transforms such as, by way of example, impulse invariant transforms or matched z-transforms, may be used without deviating from the scope of this invention.

As mentioned above, the above-described method for computing baseline wander estimates was based on a particular pre-selected model for the channel 110; namely, a single pole HPF. An alternative type of model for the channel 110 is a second-order HPF, which may be realized, for example, by a concatenation of two single-pole HPF's such as those described above. The parameters of a second-order HPF may include a channel baud rate $f_c$, and two fractional corner frequencies, $\alpha_1$ and $\alpha_2$, corresponding to the two respective single-pole HPFs that are concatenated. As with the single pole HPF described above, these parameters can be pre-selected based on, for example, experimentation with the channel 110.

The baseline wander estimates B(k) for the path memory 166 using a second-order HPF model will include three components: a first baseline wander component $B_1(k)$ due to the first single-pole HPF, a second baseline wander component $B_2(k)$ due to the second single-pole HPF, and a third baseline wander component $B_3(k)$ due to the interaction of the two single-pole HPFs.

More particularly, using similar computation as described in connection with the single-pole HPF model, one exemplary method for computing the first baseline wander component $B_1(k)$ can be expressed recursively as:

$$B_1(k) = \frac{1}{1+2\pi\alpha_1}[B_1(n-1) + 2\pi\alpha_1 a(k-1)] \quad (26)$$

Similarly, the second baseline wander component $B_2(k)$ can be expressed as:

$$B_2(k) = \frac{1}{1+2\pi\alpha_2}[B_2(k-1) + 2\pi\alpha_2 a(k-1)] \quad (27)$$

Finally, the third baseline wander component $B_3(k)$ can be expressed as:

$$B_3(k) = \frac{1}{(1+2\pi\alpha_1)(1+2\pi\alpha_2)} \cdot \quad (28)$$

$$[2(1+\pi\alpha_1+\pi\alpha_2)B_3(k-1) - B_3(n-2) + 4\pi^2\alpha_1\alpha_2\alpha(k-1)]$$

where ● denotes scalar multiplication.

The overall baseline wander estimate B(k) can then be expressed as:

$$B(k) = B_1(k) + B_2(k) - B_3(k) \quad (29)$$

These update equations are based on pre-selected HPF models for the channel 110. However, in practice, the realized response of the channel 110 may deviate from the HPF response of the pre-selected model. Moreover, the realized response of the channel 110 may be time varying (i.e., drift over time) which adds additional mismatch between the pre-selected model response and the realized response. Thus, in accordance with one aspect of the invention, the baseline wander estimator 150b includes an adaptive estimate circuit to compensate for the model mismatch.

Figure 8A:
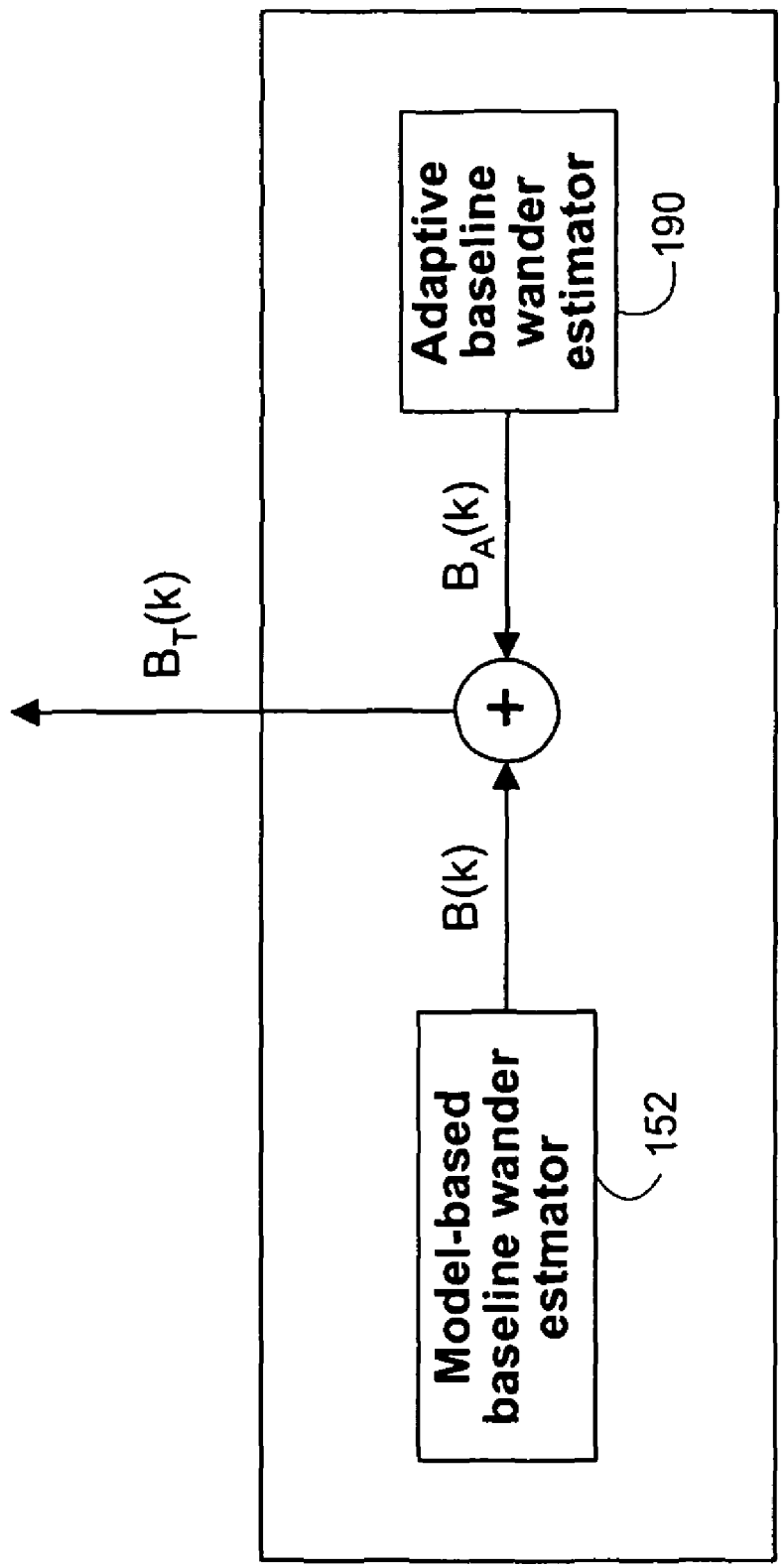
FIG. 8A shows an exemplary baseline wander estimator.
Figure 8B:
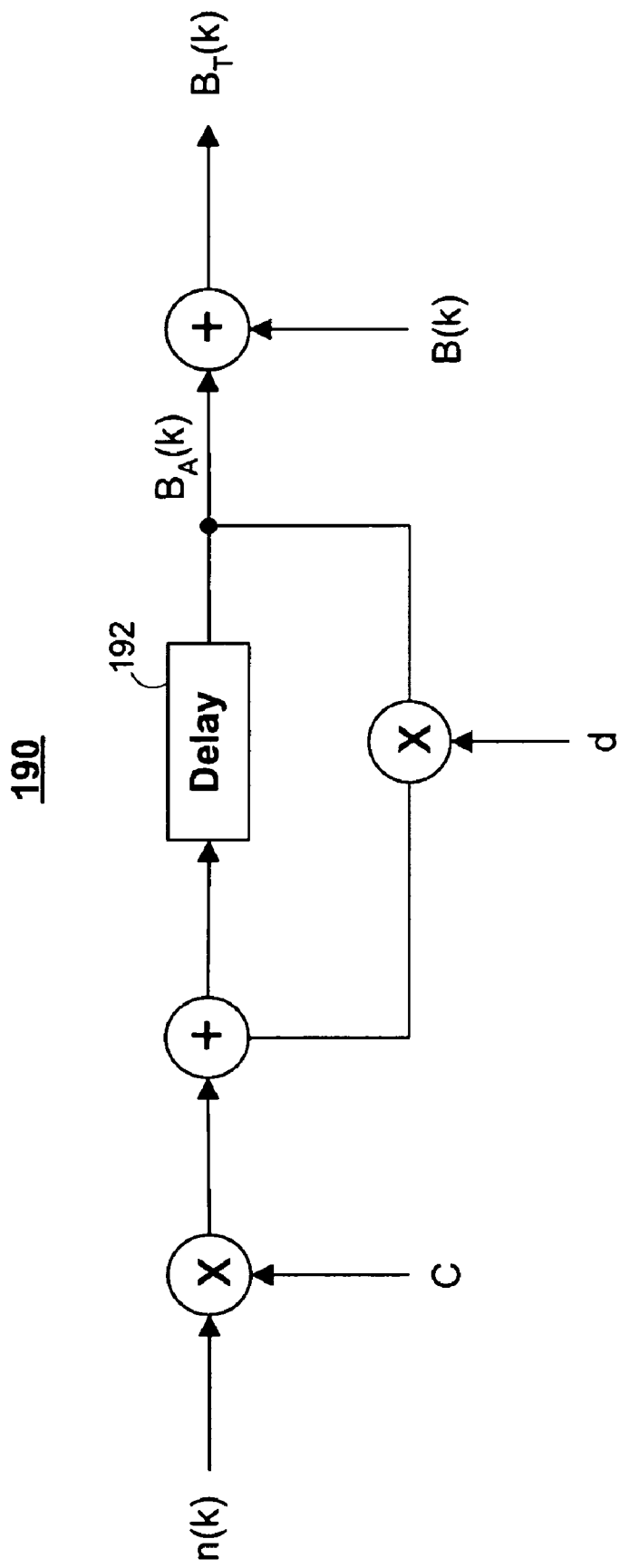
FIG. 8B shows an adaptive baseline wander estimator.

FIG. 8A shows a block diagram of the exemplary baseline wander estimator 150b in an embodiment that includes both a model-based baseline wander estimator 152 and an adaptive baseline wander estimator 190, and FIG. 8B shows the adaptive baseline wander estimator 190. The model-based baseline wander estimator 152 generates a baseline wander estimate B(k) based on models, such as high pass filter models, as was described above. In addition, the baseline wander estimator 150b includes the adaptive baseline wander estimator 190 that computes an adaptive baseline wander estimate $B_A(k)$ which is added to the model-based baseline wander estimate B(k) discussed above, in order to determine the total baseline wander estimate $B_T(k)$, as depicted in FIGS. 8A-B and in the following equation:

$$B_T(k) = B(k) + B_A(k) \quad (30)$$

As shown in FIG. 8B, the adaptive baseline wander estimator 190 determines the adaptive baseline wander estimate $B_A(k)$ at stage k for the path memory 166 based on an estimate of the noise n(k) at the stage k. The estimate of the noise n(k) is based on the candidate signal element a(k) that corresponds to the branch 166c of the path memory 166, the already computed, model-based baseline wander estimate B(k−1), and the received signal sample y(k). More particularly, having a received signal sample y(k), an exemplary method for generating a noise estimate n(k) corresponding to the path memory 166 is by solving the equation:

$$y(k) = a(k) - B(k) + n(k) \quad (31)$$

for n(k). Thus, the noise estimate n(k) is an estimate of the noise component of the received signal y(k) based on the assumption that the path memory 166 corresponds to the true input data sequence 106.

The adaptive baseline wander estimator 190 is configured as a low pass filter with a cutoff frequency that is based on parameters c and d, and processes the noise estimates n(k) accordingly. More particularly, the adaptive baseline wander estimator 190 multiplies the noise estimate n(k) by a constant scalar factor c. Next, this quantity is added to feedback from the output $B_A(k)$ of the adaptive baseline wander estimator 190 multiplied by the constant scalar factor d. The resultant quantity is then delayed by the delay 192.

The low-pass filter computation can be written as:

$$B_A(k) = dB_A(k-1) + cn(k) \quad (32)$$

where c is a small constant. In certain exemplary implementations, d=1−c, so that $B_A(k)$ is a weighted average of $B_A(k-1)$ and n(k).

In embodiments in which the adaptive baseline wander estimator 190 is used, the Viterbi equations described above (cf. Equations (7-10)) are modified to reflect the adaptive baseline wander estimate terms $B_A(k)$ by compensating based on the total baseline wander estimate $B_T(k)$ instead of just the model-based baseline wander estimate B(k). More particularly, the equations can be expressed as:

If $u_{00,2} + (y(3) + B_T(3) - a(3))^2 < u_{01,2} + (y(3) + B'_T(3) - a'(3))^2$, choose 166 as the survivor path. (33)

If $u_{00,2} + (y(3) + B_T(3) - a(3))^2 > u_{01,2} + (y(3) + B'_T(3) - a'(3))^2$, choose 168 as the survivor path. (34)

If $u_{00,2} + (y(3) + B_T(3) - a(3))^2 = u_{01,2} + (y(3) + B'_T(3) - a'(3))^2$, randomly choose (or choose based on a pre-determined rule) between 166 and 168 as the survivor path. (35)

Set $u_{00,3} = \min\{u_{00,2} + (y(3) + B_T(3) - a(3))^2, u_{01,2} + (y(3) + B'_T(3) - a'(3))^2\}$ (36)

As described above, and as can be seen in connection with Equation (22), exemplary baseline wander estimations for a stage k described herein are based on baseline wander estimates for a previous stage k−1 and a data element from a survivor path a (k−1). However, in certain implementations, information on which paths have been chosen as survivors at stage k−1 may not be available at stage k. One example of this is when the detector 112 implements a pipelined Viterbi algorithm.

Pipelined Viterbi implementations may be useful depending on the processor speed, memory specifications, and/or physical space availability of a processor on which the modified detector 150 is implemented, and/or on the delay requirements of an application at hand.

In pipelined Viterbi implementations, information on which paths have been chosen as survivors at stage k−1 may not be available at stage k due to circuit latency and the pipelined structure of the algorithm. More particularly, at a stage k, information on survivor paths may only be available up to a time k−D, where D is a positive integer greater than 1, and in some cases may be significantly greater than 1.

In order to perform baseline wander estimation and compensation in such a case, exemplary embodiments of the invention compute a baseline wander estimate $B_T(k-D+1)$ corresponding to the survivor path at time k−D with the lowest Viterbi metric among all survivor paths in all states. The baseline wander estimate $B_T(k-D+1)$ is computed recursively in a manner similar to the recursive computation of Equation (22):

$$B_T(k-D+1) = (1-\Delta)B_T(k-D) + \Delta a(k-D) \quad (37)$$

where a(k−D) corresponds to the candidate signal of the path memory having the lowest Viterbi metric at time k−D. The survivor path with the lowest Viterbi metric is determined by computing Viterbi metrics for each survivor path as described above and comparing these Viterbi metrics.

Next, once the baseline wander estimate $B_T(k-D+1)$ is computed, this estimate is used as the baseline wander estimate for all of the Viterbi metric calculations at time k. By way of example, and with reference to FIG. 7, if the path memory 166 has the lowest Viterbi metric at time k=1, then at time k=3 the detector 112 may choose a survivor path based on the following equations:

If $u_{00,2} + (y(3) + B_T(1) - a(3))^2 < u_{01,2} + (y(3) + B'_T(1) - a'(3))^2$, choose 166 as the survivor path. (38)

If $u_{00,2}+(y(3)+B_T(1)-a(3))^2 > u_{01,2}+(y(3)+B'_T(1)-a'(3))^2$, choose 168 as the survivor path. (39)

If $u_{00,2}+(y(3)+B_T(1)-a(3))^2 = u_{01,2}+(y(3)+B'_T(1)-a'(3))^2$, randomly choose (or choose based on a pre-determined rule) between 166 and 168 as the survivor path. (40)

PERFORMANCE EXAMPLES

Figure 9:
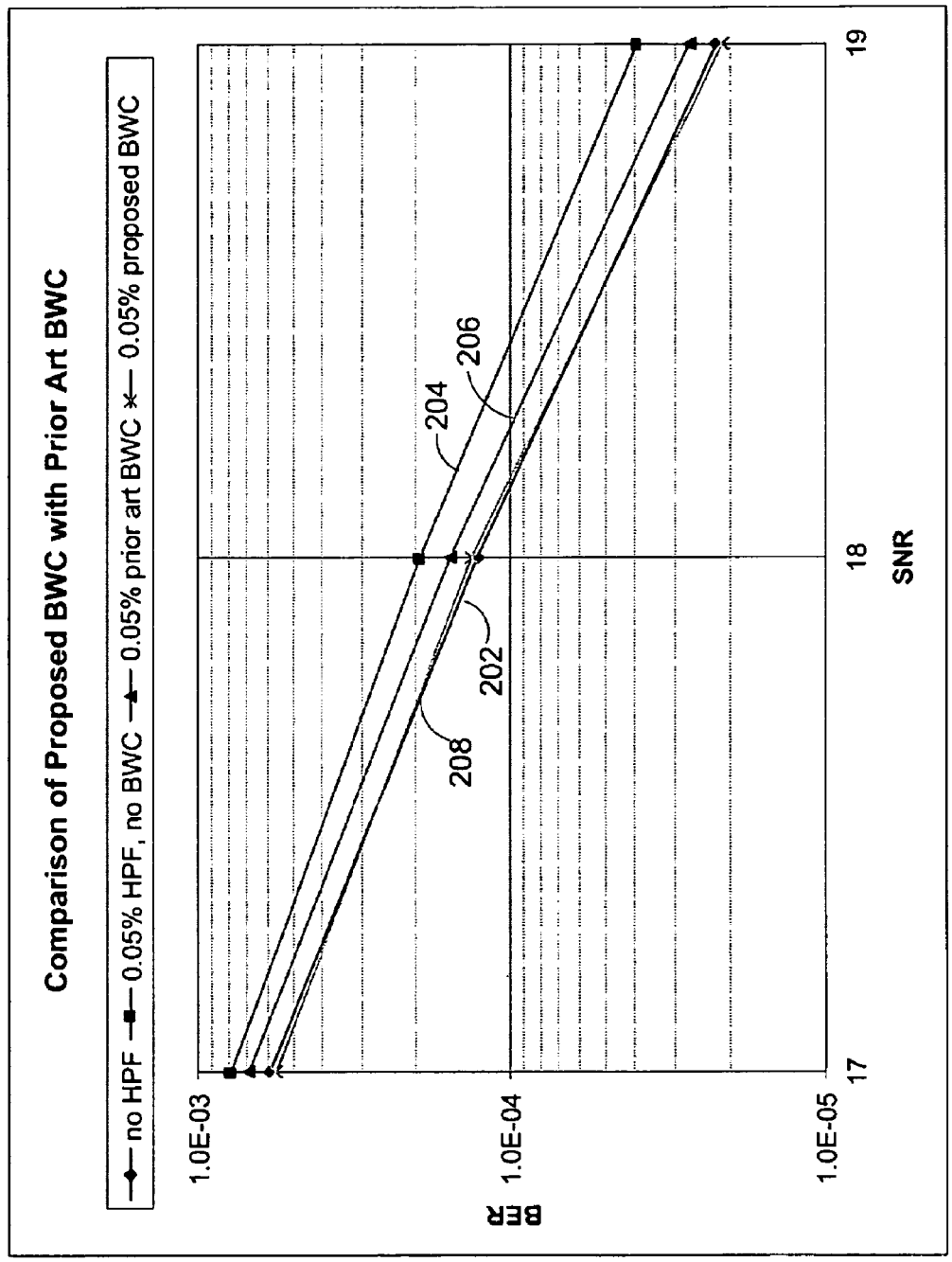
FIGS. 9 and 10 show exemplary performance results.

FIGS. 9-13 show exemplary performance results. More particularly, FIG. 9 shows a performance result for an exemplary perpendicular recording channel having a channel density of 1. The BER 202 of the exemplary channel with no HPF stages and no baseline wander estimation or compensation is set forth on a logarithmic scale on the vertical axis and plotted against the SNR of the channel input signal 104, and its plot is marked by a diamond. The exemplary channel with a HPF stage having a corner frequency of α=0.05% and with no baseline wander estimation or compensation has the BER 204, and its plot is marked by a square. The exemplary channel with the HPF stage using the system 130 of FIG. 4 (with baseline wander estimator 132) has the BER 206, and its plot is marked by a triangle. As shown, the system 130 provides an improvement in BER when compared to a system with no baseline wander compensation. Finally, the exemplary channel with the HPF stage using the modified detector 150 of FIG. 6 has the BER 208, and its plot is marked by a cross. As shown, the modified detector 150 results in a BER that is substantially equivalent to the case when there was no HPF stage distorting low frequency components at all.

In the example of FIG. 9, the model of the channel used by the modified detector 150 uses the same parameters, such as α=0.05%, as the actual channel and thus there is no mismatch between the model and the channel. Our experience has shown that the proposed algorithm is insensitive to moderate model mismatch.

Figure 10:
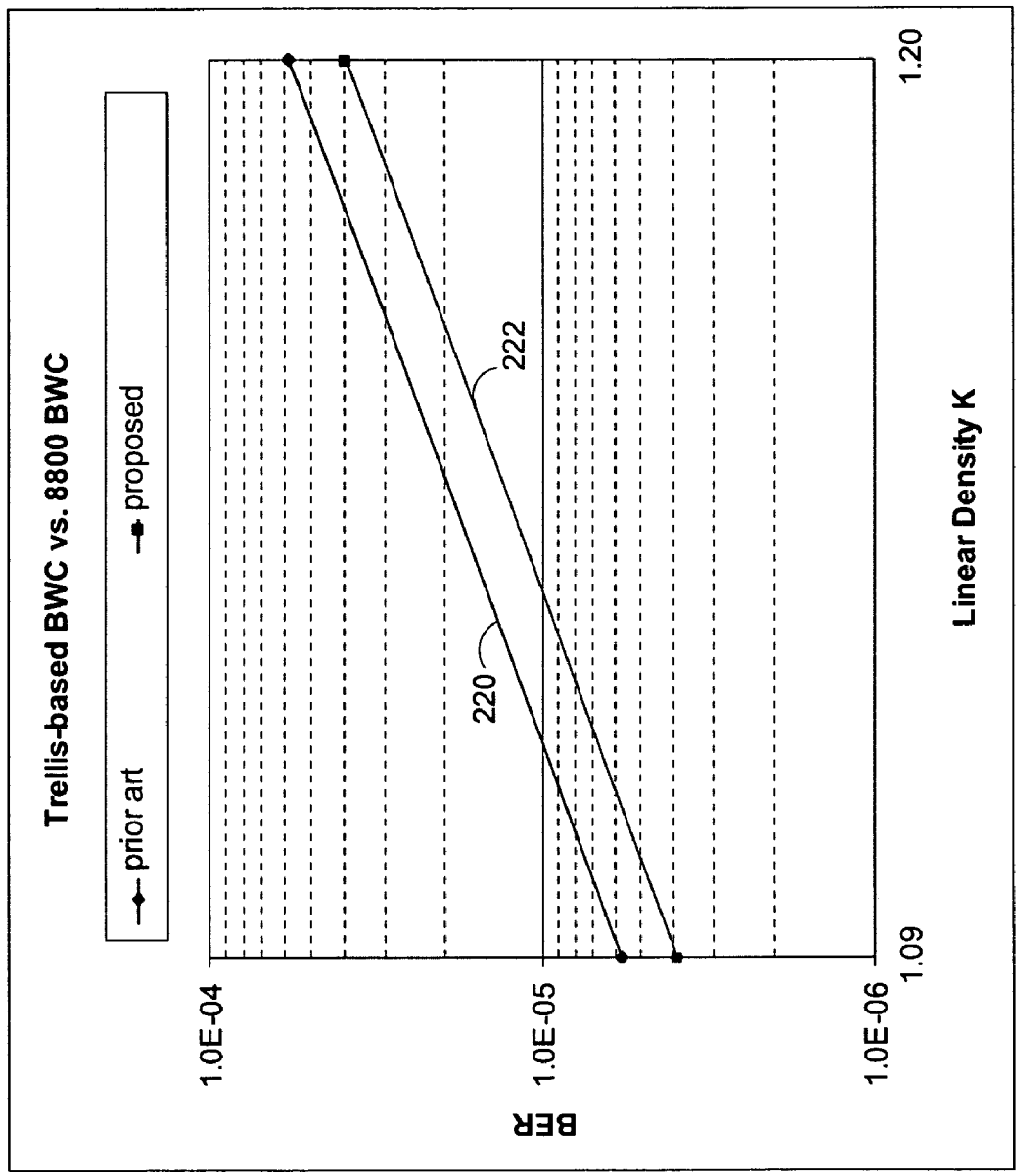

FIG. 10 shows a performance example where exemplary waveforms were captured from a Toshiba 1.8' drive and processed with channels configured with the baseline wander estimation and compensation methods discussed in connection with the system 130 of FIG. 4, and the system 154 of FIG. 6. Various channel configurations were used for the experimentation, and all resulted in identical or substantially similar performance curves as those illustrated in FIG. 10. The system 154 of FIG. 6 has an improved BER 222 when compared to the BER 220 of the system 130 of FIG. 4.

Accordingly, what have been described thus far are systems and methods for estimating and compensating for baseline wander. The components of the illustrated figures can be implemented using digital hardware, analog hardware, and/or a processor architecture with programmable instructions.

Referring now to FIGS. 11A-11G, various exemplary implementations of the present invention are shown.

Figure 11A:
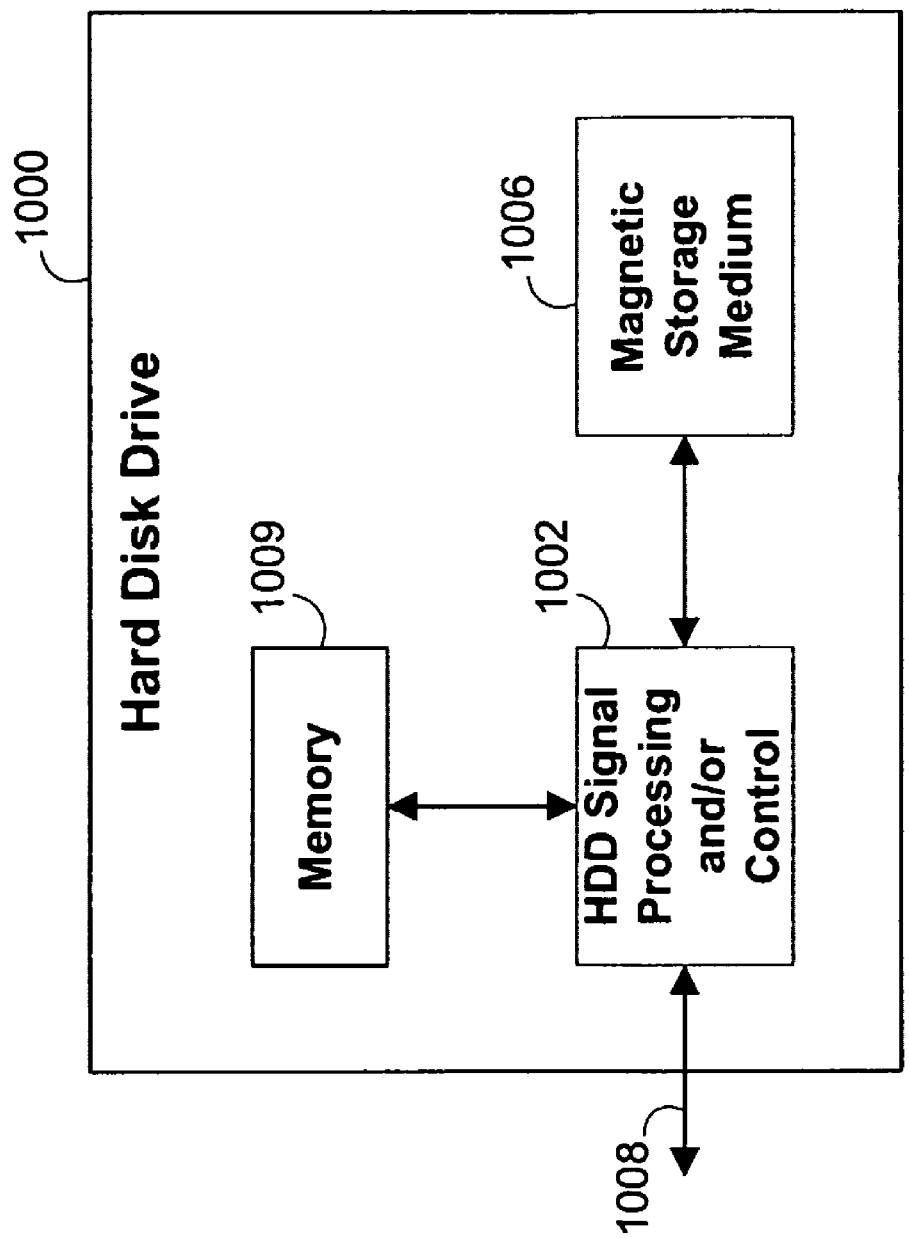
FIG. 11A is a block diagram of an exemplary hard disk drive that can employ the disclosed technology.

Referring now to FIG. 11A, the present invention can be implemented in a hard disk drive 1000. The present invention may implement either or both signal processing and/or control circuits, which are generally identified in FIG. 11A at 1002. In some implementations, the signal processing and/or control circuit 1002 and/or other circuits (not shown) in the HDD 1000 may process data, perform coding and/or encryption, perform calculations, and/or format data that is output to and/or received from a magnetic storage medium 1006.

The HDD 1000 may communicate with a host device (not shown) such as a computer, mobile computing devices such as personal digital assistants, cellular phones, media or MP3 players and the like, and/or other devices via one or more wired or wireless communication links 1008. The HDD 1000 may be connected to memory 1009 such as random access memory (RAM), low latency nonvolatile memory such as flash memory, read only memory (ROM) and/or other suitable electronic data storage.

Figure 11B:
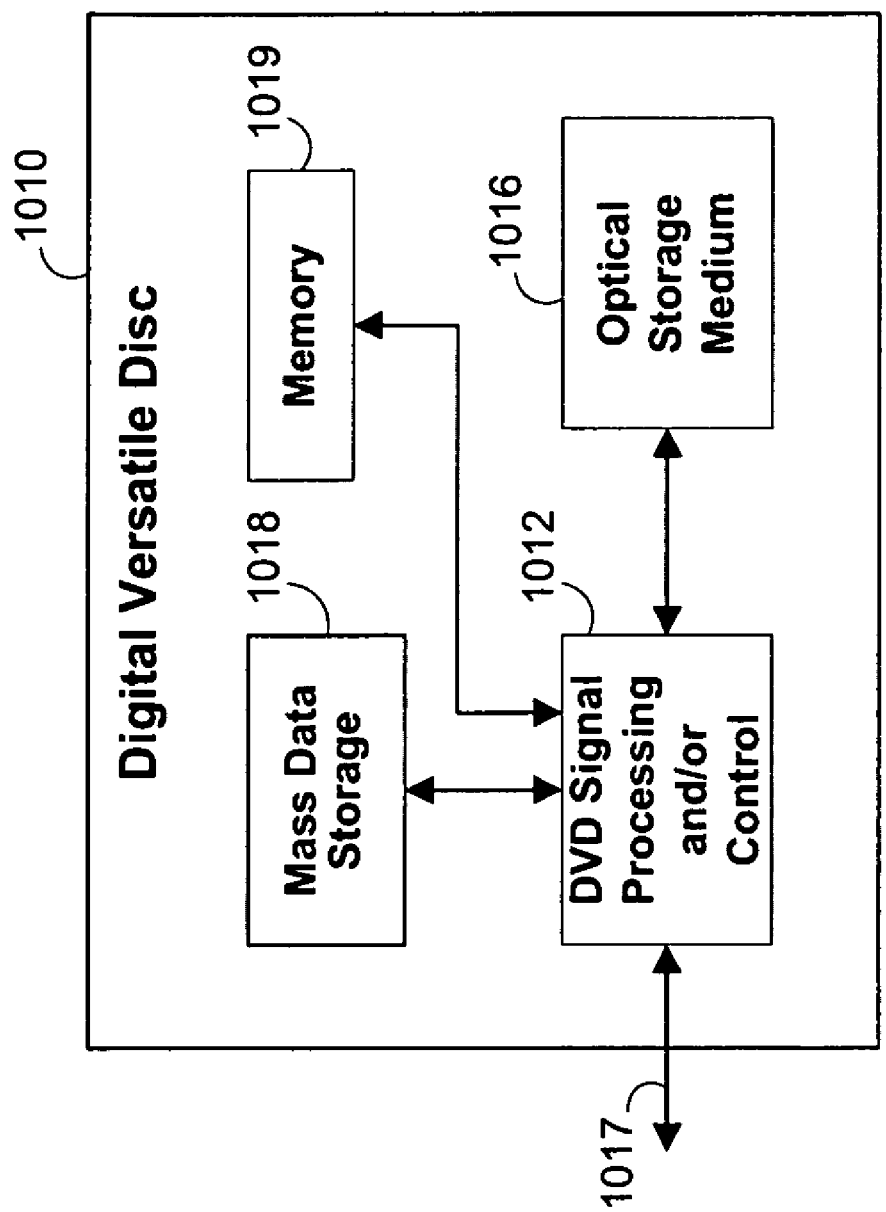
FIG. 11B is a block diagram of an exemplary digital versatile disc that can employ the disclosed technology.

Referring now to FIG. 11B, the present invention can be implemented in a digital versatile disc (DVD) drive 1010. The present invention may implement either or both signal processing and/or control circuits, which are generally identified in FIG. 11B at 1012, and/or mass data storage of the DVD drive 1010. The signal processing and/or control circuit 1012 and/or other circuits (not shown) in the DVD drive 1010 may process data, perform coding and/or encryption, perform calculations, and/or format data that is read from and/or data written to an optical storage medium 1016. In some implementations, the signal processing and/or control circuit 1012 and/or other circuits (not shown) in the DVD drive 1010 can also perform other functions such as encoding and/or decoding and/or any other signal processing functions associated with a DVD drive.

The DVD drive 1010 may communicate with an output device (not shown) such as a computer, television or other device via one or more wired or wireless communication links 1017. The DVD drive 1010 may communicate with mass data storage 1018 that stores data in a nonvolatile manner. The mass data storage 1018 may include a hard disk drive (HDD). The HDD may have the configuration shown in FIG. 11A. The HDD may be a mini HDD that includes one or more platters having a diameter that is smaller than approximately 1.8". The DVD drive 1010 may be connected to memory 1019 such as RAM, ROM, low latency nonvolatile memory such as flash memory and/or other suitable electronic data storage.

Figure 11C:
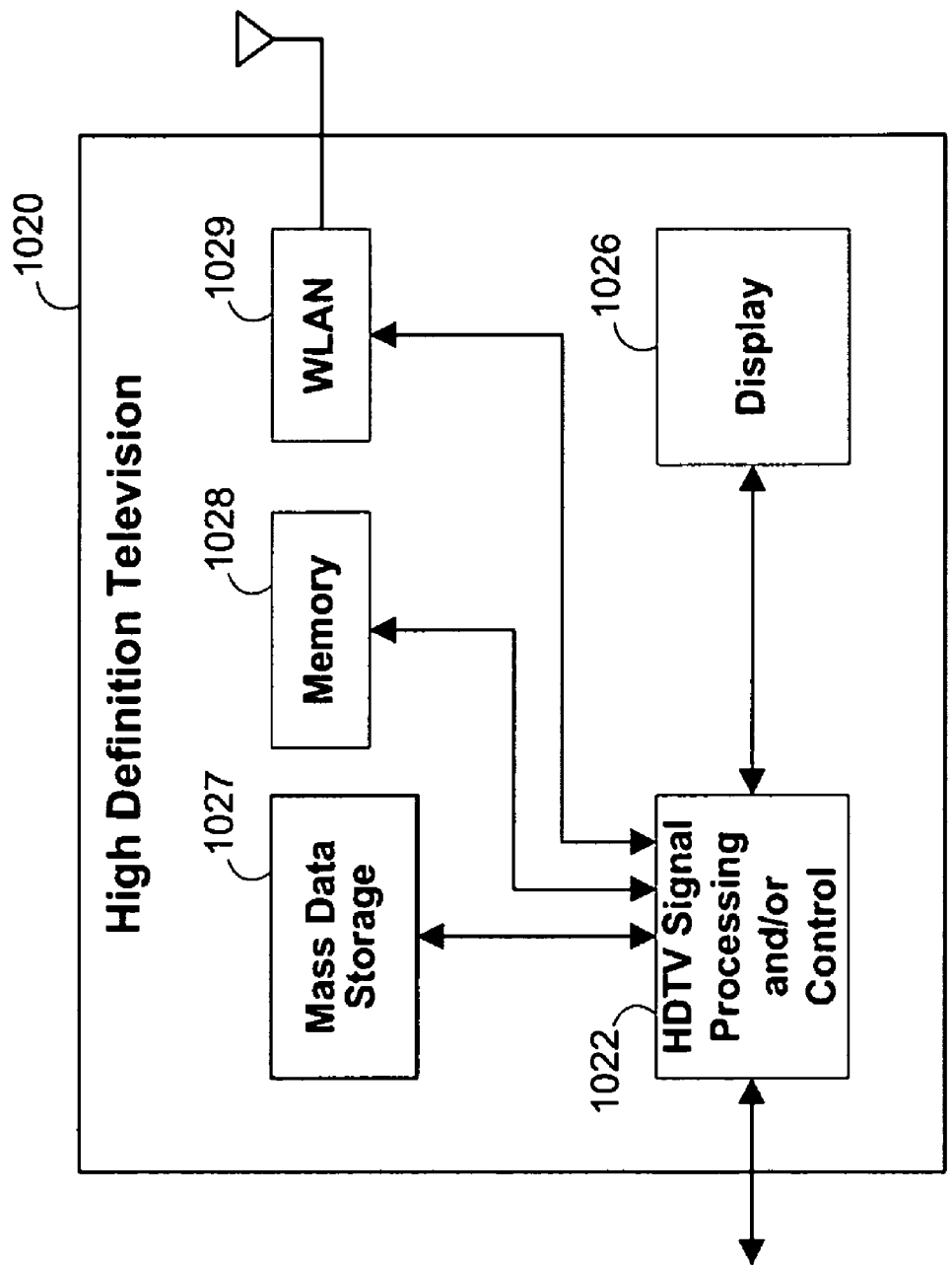
FIG. 11C is a block diagram of an exemplary high definition television that can employ the disclosed technology.
Figure 11D:
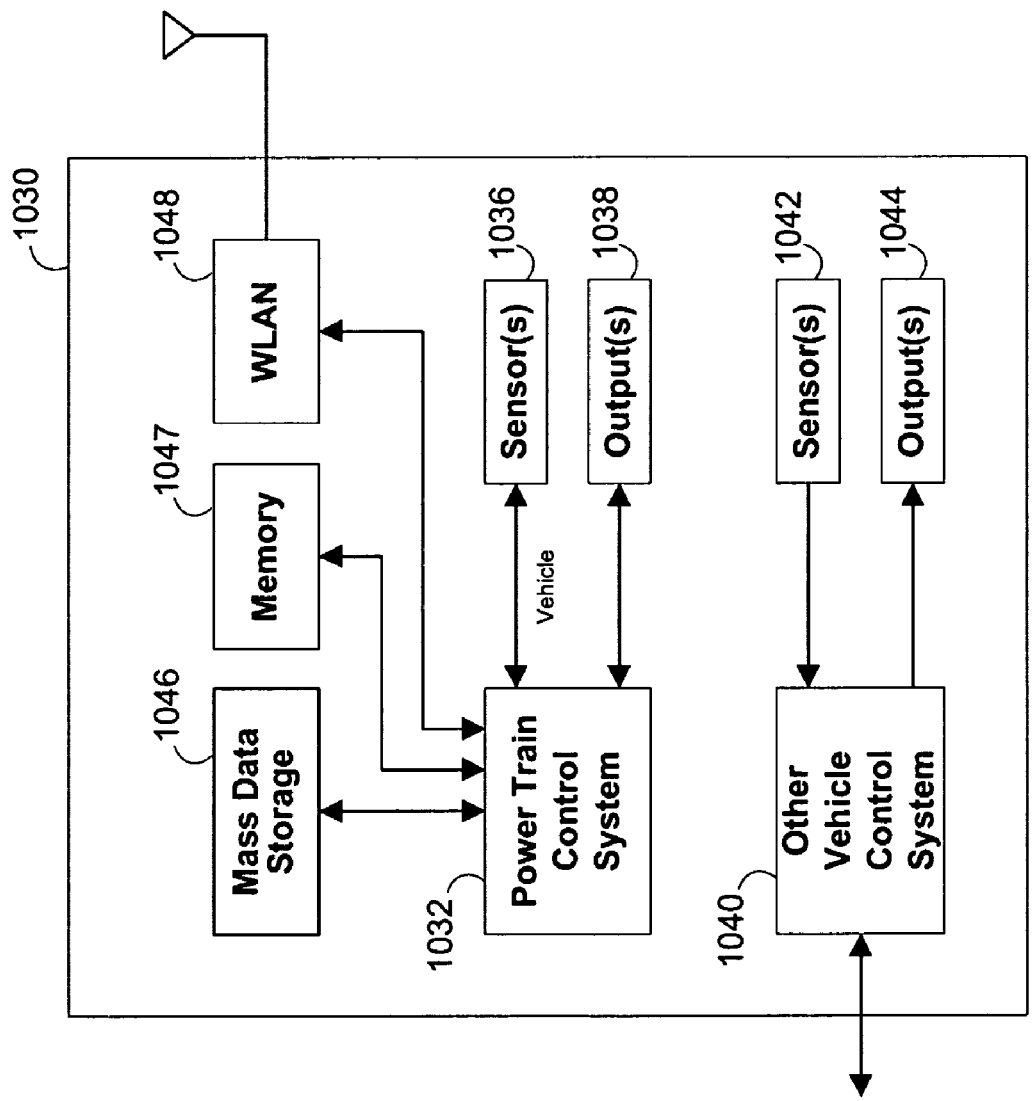
FIG. 11D is a block diagram of an exemplary vehicle that can employ the disclosed technology.

Referring now to FIG. 11C, the present invention can be implemented in a high definition television (HDTV) 1020. The present invention may implement either or both signal processing and/or control circuits, which are generally identified in FIG. 11C at 1022, a WLAN interface and/or mass data storage of the HDTV 1020. The HDTV 1020 receives HDTV input signals in either a wired or wireless format and generates HDTV output signals for a display 1026. In some implementations, signal processing circuit and/or control circuit 1022 and/or other circuits (not shown) of the HDTV 1020 may process data, perform coding and/or encryption, perform calculations, format data and/or perform any other type of HDTV processing that may be required.

The HDTV 1020 may communicate with mass data storage 1027 that stores data in a nonvolatile manner such as optical and/or magnetic storage devices. At least one HDD may have the configuration shown in FIG. 11A and/or at least one DVD drive may have the configuration shown in FIG. 11B. The HDD may be a mini HDD that includes one or more platters having a diameter that is smaller than approximately 1.8". The HDTV 1020 may be connected to memory 1028 such as RAM, ROM, low latency nonvolatile memory such as flash memory and/or other suitable electronic data storage. The HDTV 1020 also may support connections with a WLAN via a WLAN network interface 1029.

Referring now to FIG. 1D, the present invention can be implemented in a control system of a vehicle 1030, a WLAN interface and/or mass data storage of the vehicle control system. In some implementations, the present invention may implement a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1040 of the vehicle 1030. The control system 1040 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with mass data storage 1046 that stores data in a nonvolatile manner. The mass data storage 1046 may include optical and/or magnetic storage devices for example hard disk drives (HDDs) and/or DVD drives. At least one HDD may have the configuration shown in FIG. 11A and/or at least one DVD drive may have the configuration shown in FIG. 11B. The HDD may be a mini HDD that includes one or more platters having a diameter that is smaller than approximately 1.8". The powertrain control system 1032 may be connected to memory 1047 such as RAM, ROM, low latency nonvolatile memory such as flash memory and/or other suitable electronic data storage. The powertrain control system 1032 also may support connections with a WLAN via a WLAN network interface 1048. The control system 1040 may also include mass data storage, memory and/or a WLAN interface (all not shown).

Figure 11E:
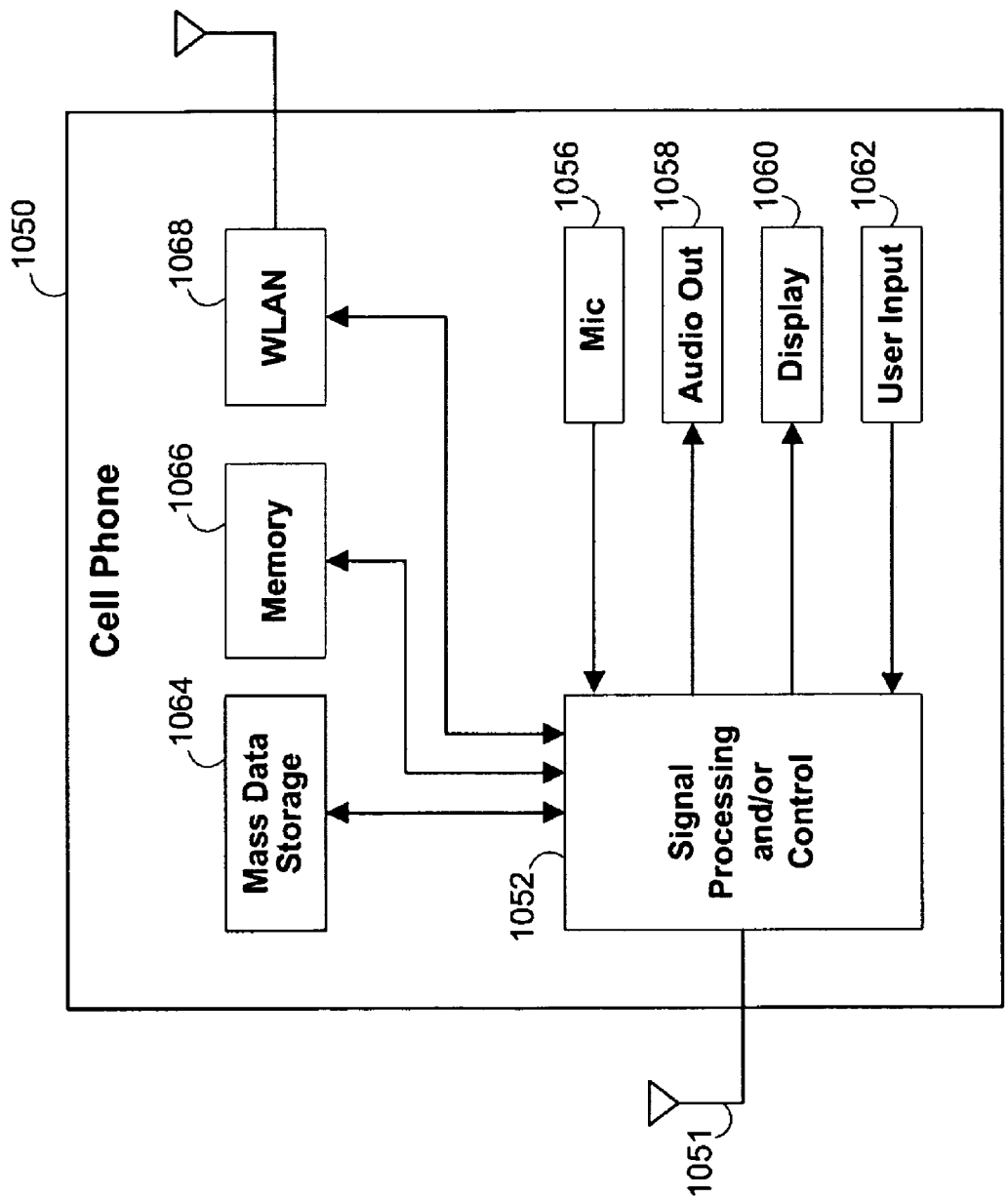
FIG. 11E is a block diagram of an exemplary cell phone that can employ the disclosed technology.

Referring now to FIG. 11E, the present invention can be implemented in a cellular phone 1050 that may include a cellular antenna 1051. The present invention may implement either or both signal processing and/or control circuits, which are generally identified in FIG. 11E at 1052, a WLAN interface and/or mass data storage of the cellular phone 1050. In some implementations, the cellular phone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular phone 1050 may process data, perform coding and/or encryption, perform calculations, format data and/or perform other cellular phone functions.

The cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 11A and/or at least one DVD drive may have the configuration shown in FIG. 11B. The HDD may be a mini HDD that includes one or more platters having a diameter that is smaller than approximately 1.8". The cellular phone 1050 may be connected to memory 1066 such as RAM, ROM, low latency nonvolatile memory such as flash memory and/or other suitable electronic data storage. The cellular phone 1050 also may support connections with a WLAN via a WLAN network interface 1068.

Figure 11F:
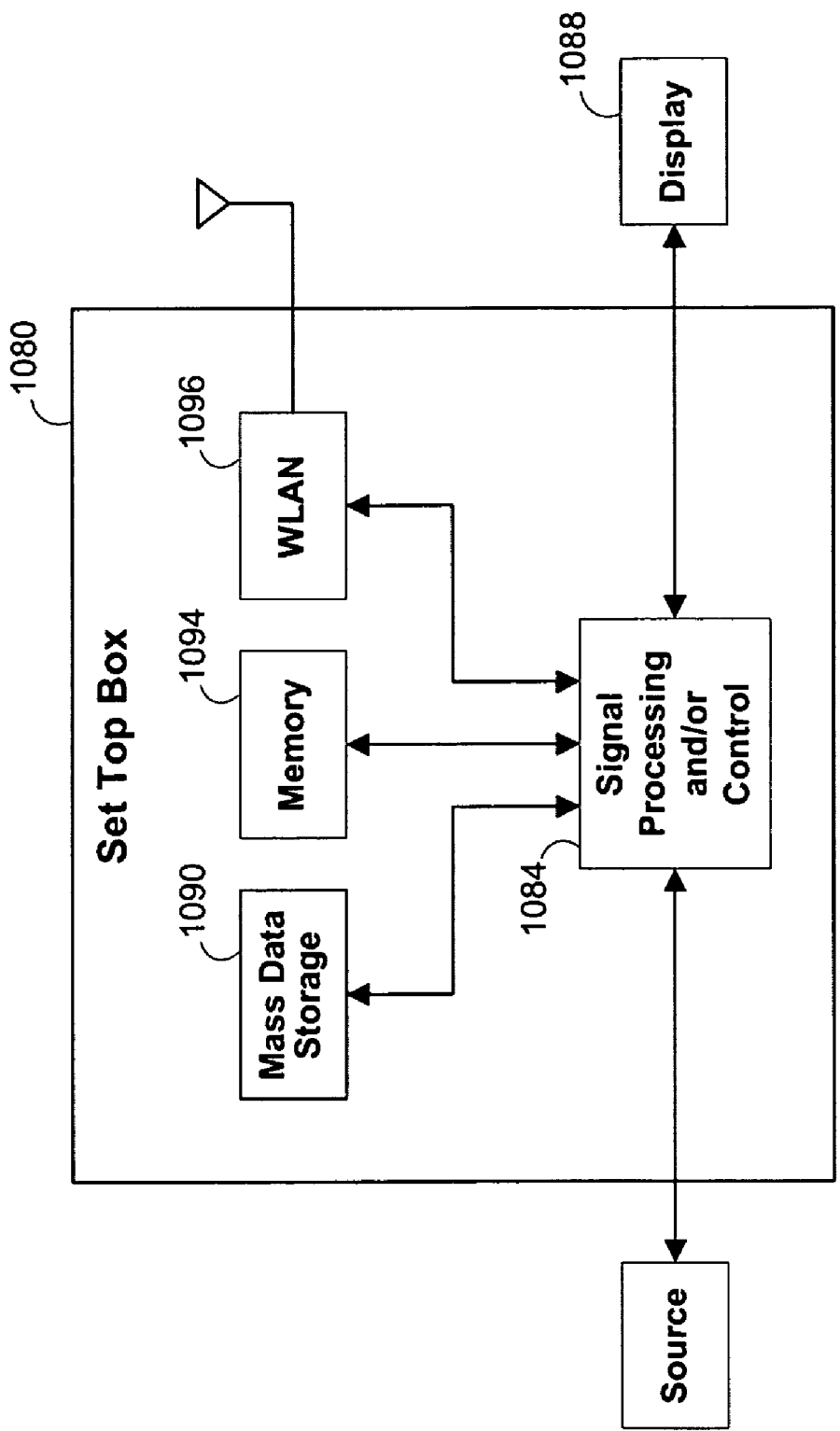
FIG. 11F is a block diagram of an exemplary set top box that can employ the disclosed technology.

Referring now to FIG. 11F, the present invention can be implemented in a set top box 1080. The present invention may implement either or both signal processing and/or control circuits, which are generally identified in FIG. 11F at 1084, a WLAN interface and/or mass data storage of the set top box 1080. The set top box 1080 receives signals from a source such as a broadband source and outputs standard and/or high definition audio/video signals suitable for a display 1088 such as a television and/or monitor and/or other video and/or audio output devices. The signal processing and/or control circuits 1084 and/or other circuits (not shown) of the set top box 1080 may process data, perform coding and/or encryption, perform calculations, format data and/or perform any other set top box function.

The set top box 1080 may communicate with mass data storage 1090 that stores data in a nonvolatile manner. The mass data storage 1090 may include optical and/or magnetic storage devices for example hard disk drives (HDDs) and/or DVD drives. At least one HDD may have the configuration shown in FIG. 11A and/or at least one DVD drive may have the configuration shown in FIG. 11B. The HDD may be a mini HDD that includes one or more platters having a diameter that is smaller than approximately 1.8". The set top box 1080 may be connected to memory 1094 such as RAM, ROM, low latency nonvolatile memory such as flash memory and/or other suitable electronic data storage. The set top box 1080 also may support connections with a WLAN via a WLAN network interface 1096.

Figure 11G:
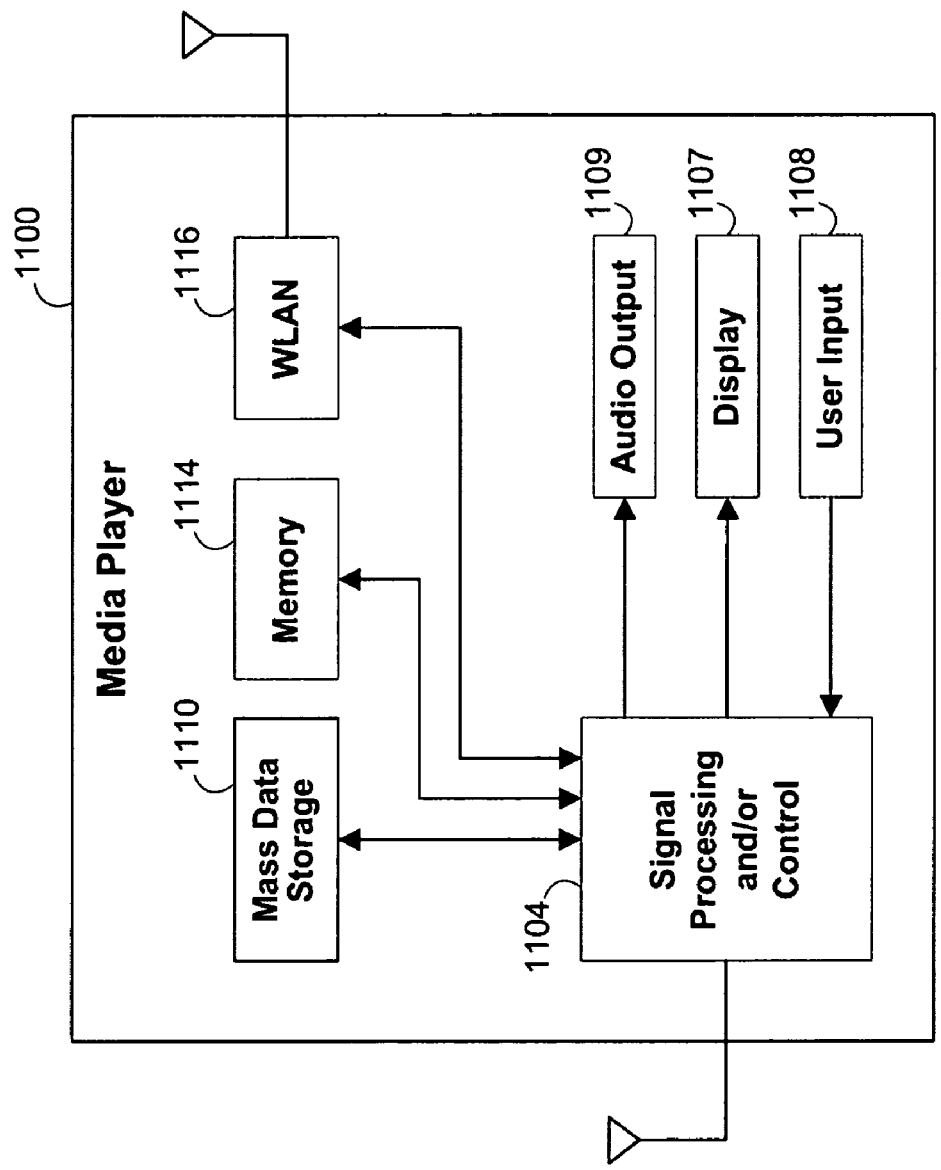
FIG. 11G is a block diagram of an exemplary media player that can employ the disclosed technology.

Referring now to FIG. 11G, the present invention can be implemented in a media player 1100. The present invention may implement either or both signal processing and/or control circuits, which are generally identified in FIG. 11G at 1104, a WLAN interface and/or mass data storage of the media player 1100. In some implementations, the media player 1100 includes a display 1107 and/or a user input 1108 such as a keypad, touchpad and the like. In some implementations, the media player 1100 may employ a graphical user interface (GUI) that typically employs menus, drop down menus, icons and/or a point-and-click interface via the display 1107 and/or user input 1108. The media player 1100 further includes an audio output 1109 such as a speaker and/or audio output jack. The signal processing and/or control circuits 1104 and/or other circuits (not shown) of the media player 1100 may process data, perform coding and/or encryption, perform calculations, format data and/or perform any other media player function.

The media player 1100 may communicate with mass data storage 1110 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives (HDDs) and/or DVD drives. At least one HDD may have the configuration shown in FIG. 11A and/or at least one DVD drive may have the configuration shown in FIG. 11B. The HDD may be a mini HDD that includes one or more platters having a diameter that is smaller than approximately 1.8". The media player 1100 may be connected to memory 1114 such as RAM, ROM, low latency nonvolatile memory such as flash memory and/or other suitable electronic data storage. The media player 1100 also may support connections with a WLAN via a WLAN network interface 1116. Still other implementations in addition to those described above are contemplated.

Accordingly, what have been described thus far are systems and methods for estimating and compensating for baseline wander. The disclosed circuits, components, and methods can be implemented using means such as digital circuitry, analog circuitry, and/or a processor architecture with programmable instructions. Additionally, components and/or methods that store information or carry signals can operate based on electrical, optical, and/or magnetic technology, and can include devices such as flip-flops, latches, random access memories, read-only memories, CDs, DVDs, disk drives, or other storage or memory means. The disclosed embodiments and illustrations are exemplary and do not limit the scope of the disclosed invention as defined by the following claims.

What is claimed is:

1. A method for detecting a signal to provide a detected data sequence, comprising:
   providing a plurality of candidate data sequences,
   computing a first plurality of baseline wander estimates associated with respective ones of the candidate data sequences,
   filtering a difference between the first plurality of baseline wander estimates and the associated respective ones of the candidate data sequences,
   computing a second plurality of baseline wander estimates associated with respective ones of the candidate data sequences based at least in part on the filtered difference,
   computing a combined plurality of baseline wander estimates associated with respective ones of the candidate data sequences based at least in part on the first plurality of baseline wander estimates and based at least in part on the second plurality of baseline wander estimates,
   comparing a metric based on the signal to respective metrics based on the respective ones of the candidate data sequences, wherein the comparisons are compensated by corresponding ones of the combined plurality of baseline wander estimates, and
   choosing, based on the comparisons, one of the plurality of candidate data sequences to be the detected data sequence.

2. The method of claim 1, wherein the comparisons are compensated by offsetting the respective metrics based on the respective ones of the candidate data sequences by corresponding ones of the combined plurality of baseline wander estimates.

3. The method of claim 1, wherein comparing the metric based on the signal and choosing one of the plurality of candidate data sequences comprises:
   comparing a first metric based on the signal to metrics based on the portions of each of the respective ones of the candidate data sequences, wherein the comparisons are compensated by corresponding ones of the first plurality of baseline wander estimates, and
   discarding one or more candidate data sequences as candidates for the detected data sequence based on the comparisons.

4. The method of claim 3, further comprising:
   comparing a second metric based on the signal to additional metrics based on the additional portions of each of the respective ones of the candidate data sequences, wherein the comparisons are compensated by corresponding ones of the second plurality of baseline wander estimates, and
   discarding additional candidate data sequences as candidates for the detected data sequence based on the comparisons.

5. The method of claim 1, wherein the candidate data sequences correspond to path memories of a Viterbi trellis.

6. The method of claim 5, wherein the first plurality of baseline wander estimates associated with respective ones of the candidate data sequences comprise a single baseline wander estimate computed at a current stage based on a baseline wander estimate associated with a pipeline delayed path memory and wherein the pipeline delayed path memory comprises a path memory at a previous stage, the previous stage being a plurality of stages prior to the current stage.

7. The method of claim 1, wherein comparing the metric based on the signal to respective metrics based on the respective ones of the candidate data sequences comprises computing a distance measure between the metric based on the signal and each of the respective metrics based on the respective ones of the candidate data sequences.

8. The method of claim 7, wherein the distance measure is based on a Euclidean distance measure.

9. The method of claim 7, wherein choosing one of the plurality of candidate data sequences comprises choosing the candidate data sequence with a corresponding metric closest to the metric based on the signal.

10. The method of claim 1, wherein computing the second plurality of baseline wander estimates comprises:
    computing the second plurality of baseline wander estimates based at least on received signal samples.

11. The method of claim 1, wherein:
    computing the first plurality of baseline wander estimates comprises computing the first plurality of baseline wander estimates based on a model of a source of baseline wander, and
    computing the second plurality of baseline wander estimates comprises computing the second plurality of baseline wander estimates based on an adaptive model of baseline wander.

12. The method of claim 11, wherein the model of the source of baseline wander comprises a high pass filter model.

13. A method for detecting a signal to provide a detected data sequence, comprising:
    providing a plurality of candidate data sequences,
    computing baseline wander estimates associated with respective ones of the candidate data sequences,
    filtering a difference between the baseline wander estimates and the associated respective ones of the candidate data sequences,
    computing noise estimates associated with respective ones of the candidate data sequences based at least in part on the filtered difference,
    adjusting the computed baseline wander estimates based at least in part on the computed noise estimates,
    comparing a metric based on the signal to respective metrics based on the respective ones of the candidate data sequences, wherein the comparisons are compensated by corresponding ones of the noise adjusted baseline wander estimates, and
    choosing, based on the comparisons, one of the plurality of candidate data sequences to be the detected data sequence.

14. The method of claim 13, wherein computing baseline wander estimates comprises computing the baseline wander estimates using an adaptive baseline wander estimator.

15. The method of claim 13, wherein computing the noise estimates further comprises computing at least one of the noise estimates based on a corresponding previously computed adaptive baseline wander estimate, an element of a corresponding candidate data sequence, and a previously received element of the signal.

16. The method of claim 13, wherein computing baseline wander estimates further comprises:
    computing at least one model-based baseline wander estimate based on a pre-selected model of a baseline wander source, and
    adding the at least one model-based baseline wander estimate to at least one adaptive baseline wander estimate.

17. A system for detecting a signal to provide a detected data sequence, comprising:
    a detector for processing a plurality of candidate data sequences, and a baseline wander estimator for:
: computing a first plurality of baseline wander estimates associated with respective ones of the candidate data sequences,
: filtering a difference between the first plurality of baseline wander estimates and the associated respective ones of the candidate data sequences,
: computing a second plurality of baseline wander estimates associated with respective ones of the candidate data sequences based at least in part on the filtered difference, and
: computing a combined plurality of baseline wander estimates associated with respective ones of the candidate data sequences based at least in part on the first plurality of baseline wander estimates and based at least in part on the second plurality of baseline wander estimates, and wherein the detector is further configured to:
: compare a metric based on the signal to respective metrics based on the respective ones of the candidate data sequences, wherein the comparisons are compensated by corresponding ones of the combined plurality of baseline wander estimates, and
: choose, based on the comparisons, one of the plurality of candidate data sequences to be the detected data sequence.

18. The system of claim 17, wherein the detector is further configured to compensate the comparisons by offsetting the respective metrics based on the respective ones of the candidate data sequences by corresponding ones of the combined plurality of baseline wander estimates.

19. The system of claim 17, wherein
the detector is configured to
compare a first metric based on the signal to metrics based on the portions of each of the respective ones of the candidate data sequences, wherein the comparisons are compensated by corresponding ones of the first plurality of baseline wander estimates, and
discard one or more candidate data sequences as candidates for the detected data sequence based on the comparisons.

20. The system of claim 19, wherein
the detector is further configured to
compare a second metric based on the signal to additional metrics based on the additional portions of each of the respective ones of the candidate data sequences, wherein the comparisons are compensated by corresponding ones of the second plurality of baseline wander estimates, and
discard additional candidate data sequences as candidates for the detected data sequence based on the comparisons.

21. The system of claim 17, wherein the candidate data sequences correspond to path memories of a Viterbi trellis.

22. The system of claim 21, wherein the first plurality of baseline wander estimates associated with respective ones of the candidate data sequences comprise a single baseline wander estimate computed at a current stage based on the baseline wander estimate associated with the pipeline delayed path memory and wherein the pipeline delayed path memory comprises a path memory at a previous stage, the previous stage being a plurality of stages prior to the current stage.

23. The system of claim 17, wherein the detector is further configured to compare the signal to each of the respective ones of the candidate data sequences by computing a distance measure between the metric based on the signal and each of the respective metrics based on the respective ones of the candidate data sequences.

24. The system of claim 23, wherein the distance measure is based on a Euclidean distance measure.

25. The system of claim 23, wherein the detector is configured to choose one of the plurality of candidate data sequences by choosing the candidate data sequence with a corresponding metric closest to the metric based on the signal.

26. The system of claim 17, wherein the baseline wander estimator is configured to compute the second plurality of baseline wander estimates by:
: computing the second plurality of baseline wander estimates based at least on received signal samples.

27. The system of claim 17, wherein the baseline wander estimator is configured to compute the first plurality of baseline wander estimates based on a model of a source of baseline wander and the second plurality of baseline wander estimates based on an adaptive model of baseline wander.

28. The system of claim 27, wherein the model of the source of baseline wander comprises a high pass filter model.

29. A system for detecting a signal to provide a detected data sequence, comprising:
: a detector for processing a plurality of candidate data sequences, and
: a baseline wander estimator for:
:: computing baseline wander estimates associated with respective ones of the candidate data sequences,
:: filtering a difference between the baseline wander estimates and the associated respective ones of the candidate data sequences,
:: computing noise estimates associated with respective ones of the candidate data sequences based at least in part on the filtered difference, and
:: adjusting the computed baseline wander estimates based at least in part on the computed noise estimates, wherein
: the detector is further configured to:
:: compare a metric based on the signal to respective metrics based on the respective ones of the candidate data sequences, wherein the comparisons are compensated by corresponding ones of the noise adjusted baseline wander estimates, and
:: choose, based on the comparisons, one of the plurality of candidate data sequences to be the detected data sequence.

30. The system of claim 29, wherein the baseline wander estimator is configured to compute adaptive baseline wander estimates.

31. The system of claim 29, wherein the baseline wander estimator is further configured to compute the noise estimates based on a corresponding previously computed adaptive baseline wander estimate, an element of a corresponding candidate data sequence, and a previously received element of the signal.

32. The system of claim 29, wherein the baseline wander estimator is configured to compute baseline wander estimates by:
: computing at least one model-based baseline wander estimate based on a pre-selected model of a baseline wander source, and
: adding the at least one model-based baseline wander estimate to the at least one adaptive baseline wander estimate.

* * * * *